United States Patent
Goto et al.

(10) Patent No.: US 10,659,004 B2
(45) Date of Patent: May 19, 2020

(54) RESONATOR AND RESONANCE DEVICE

(71) Applicant: Murata Manufacturing Co., Ltd., Nagaokakyo-shi, Kyoto-fu (JP)

(72) Inventors: Yuichi Goto, Nagaokakyo (JP); Wakana Hirota, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 461 days.

(21) Appl. No.: 15/723,344

(22) Filed: Oct. 3, 2017

(65) Prior Publication Data

US 2018/0048286 A1 Feb. 15, 2018

Related U.S. Application Data

(63) Continuation of application No. PCT/JP2015/079755, filed on Oct. 21, 2015.

(Continued)

(51) Int. Cl.
*H03H 9/21* (2006.01)
*H03H 9/17* (2006.01)
(Continued)

(52) U.S. Cl.
CPC .......... *H03H 9/172* (2013.01); *H03H 3/0072* (2013.01); *H03H 9/02338* (2013.01);
(Continued)

(58) Field of Classification Search
CPC .. B06B 1/0603; B06B 1/0607; H03H 9/2489; H03H 9/2494; H03H 9/2478;
(Continued)

(56) References Cited

U.S. PATENT DOCUMENTS

| 5,986,381 A | 11/1999 | Hoen et al. |
| 8,110,966 B2 | 2/2012 | Iwai |

(Continued)

FOREIGN PATENT DOCUMENTS

| JP | S54-58395 A | 5/1979 |
| JP | S56-85921 A | 7/1981 |

(Continued)

OTHER PUBLICATIONS

Written Opinion of the International Searching Authority issued in International Application No. PCT/JP2016/063115, dated Jul. 19, 2016.

(Continued)

*Primary Examiner* — J. San Martin
(74) *Attorney, Agent, or Firm* — Arent Fox LLP

(57) ABSTRACT

A resonance device is provided having a resonator with opposing upper and lower lids. The resonator includes a base, and multiple vibration arms that are connected to a front end of the base so as to extend away from the base. Moreover, a frame surrounds a periphery of the base portion and the vibration arms and one or more holding arms connect the base to the frame. The base, the vibration arms, and the holding arm include a substrate and a temperature characteristics correction layer laminated on the substrate and having a material with a coefficient of thermal expansion different from that of the substrate. The base, the vibration arms, and the holding arm are formed integrally with the substrate and the temperature characteristics correction layer.

20 Claims, 16 Drawing Sheets

Related U.S. Application Data

(60) Provisional application No. 62/153,757, filed on Apr. 28, 2015, provisional application No. 62/153,049, filed on Apr. 27, 2015.

(51) Int. Cl.
| | | |
|---|---|---|
| *H03H 9/02* | (2006.01) | |
| *H03H 3/007* | (2006.01) | |
| *H03H 9/10* | (2006.01) | |
| *H03H 9/05* | (2006.01) | |
| *H03H 9/24* | (2006.01) | |
| *H03H 9/15* | (2006.01) | |

(52) U.S. Cl.
CPC ........ *H03H 9/0595* (2013.01); *H03H 9/1057* (2013.01); *H03H 9/178* (2013.01); *H03H 9/2489* (2013.01); *H03H 2009/155* (2013.01)

(58) Field of Classification Search
CPC .. H03H 9/2484; H03H 9/2473; H03H 9/2468; H03H 9/21; H03H 9/215; H03H 9/178; H03H 9/172; H03H 2003/0492; H03H 2003/026
See application file for complete search history.

(56) References Cited

U.S. PATENT DOCUMENTS

| | | |
|---|---|---|
| 8,120,234 B2 | 2/2012 | Iwai |
| 8,191,216 B2 | 6/2012 | Yamazaki et al. |
| 8,227,958 B2 | 7/2012 | Inoue et al. |
| 8,347,719 B2 | 1/2013 | Iwai |
| 8,415,863 B2 | 4/2013 | Yamazaki et al. |
| 9,748,921 B2 | 8/2017 | Yamazaki et al. |
| 2008/0134781 A1 | 6/2008 | Noguchi et al. |
| 2008/0290490 A1 | 11/2008 | Fujii et al. |
| 2009/0174286 A1* | 7/2009 | Yoshimatsu ............ H03H 3/04 310/321 |
| 2009/0178260 A1 | 7/2009 | Yamazaki et al. |
| 2010/0079040 A1* | 4/2010 | Iwai ................. H03H 9/02133 310/370 |
| 2010/0133958 A1* | 6/2010 | Umeki .................... H01L 41/29 310/364 |
| 2010/0156246 A1* | 6/2010 | Iwai ....................... H03H 3/04 310/344 |
| 2010/0201221 A1 | 8/2010 | Inoue et al. |
| 2012/0212109 A1 | 8/2012 | Yamazaki et al. |
| 2013/0283910 A1 | 10/2013 | Nishizawa et al. |
| 2013/0305824 A1 | 11/2013 | Nishizawa et al. |
| 2014/0084752 A1 | 3/2014 | Vellianitis |
| 2014/0290362 A1* | 10/2014 | Nakagawa ......... G01C 19/5607 73/504.16 |
| 2016/0197597 A1 | 7/2016 | Yamada et al. |
| 2016/0290802 A1 | 10/2016 | Nakagawa |
| 2017/0179926 A1 | 6/2017 | Hirota et al. |

FOREIGN PATENT DOCUMENTS

| | | |
|---|---|---|
| JP | S56-85922 A | 7/1981 |
| JP | S58-111515 A | 7/1983 |
| JP | 2007-123683 A | 5/2007 |
| JP | 2009-089231 A | 4/2009 |
| JP | 2009-171118 A | 7/2009 |
| JP | 2010-187054 A | 8/2010 |
| JP | 2010-283804 A | 12/2010 |
| JP | 5071058 B2 | 11/2012 |
| JP | 2015-33087 A | 2/2015 |
| WO | WO 2015/041152 A1 | 3/2015 |

OTHER PUBLICATIONS

International Search Report issued in International Application No. PCT/JP2015/079755, dated Nov. 24, 2016.
International Search Report issued in International Application No. PCT/JP2016/062873, dated Jul. 12, 2016.
International Search Report issued in International Application No. PCT/JP2016/063115, dated Jul. 19, 2016.
Written Opinion of the International Searching Authority issued in International Application No. PCT/JP2015/079755, dated Nov. 24, 2016.
Written Opinion of the International Searching Authority issued in International Application No. PCT/JP2016/062873, dated Jul. 12, 2016.

* cited by examiner

RESONATOR AND RESONANCE DEVICE

CROSS REFERENCE TO RELATED APPLICATIONS

The present application is a continuation of PCT/JP2015/079755 filed Oct. 21, 2015, which claims priority to U.S. Patent Provisional Application No. 62/153,757, filed Apr. 28, 2015, and U.S. Patent Provisional Application No. 62/153,049, filed Apr. 27, 2015, the entire contents of each of which are incorporated herein by reference.

TECHNICAL FIELD

The present disclosure relates to a resonator and a resonance device in which a plurality of vibration arms vibrate in a flexural vibration mode.

BACKGROUND

To date, resonance devices that employ the MEMS (Micro Electro Mechanical Systems) technique are used, for example, as timing devices. In general, such resonance devices are mounted on a printed board embedded in an electronic device, such as a smartphone. The resonance devices include a lower side substrate, an upper side substrate that, together with the lower side substrate, forms a cavity therebetween, and a resonator disposed within the cavity between the lower side substrate and the upper side substrate.

For example, Patent Document 1 (identified below) discloses an out-of-plane flexural resonator that includes a plurality of vibration arms. In this resonator, the vibration arms are connected at fixed ends thereof to a front end of a base portion, and the base portion is connected at a rear end thereof on a side opposite to the front end to a support portion. The support portion is connected, for example, to a base stage sandwiched between the lower side substrate and the upper side substrate. In the example illustrated in FIG. 1 of Patent Document 1, the electric fields applied to the vibration arms are set to be oriented in mutually opposite directions, and thus vibrations of mutually opposite phases are achieved between the vibration arm in an inner side portion and the two vibration arms in an outer side portion.

Patent Document 1: Japanese Patent No. 5071058.

SUMMARY

In conventional resonators, the vibration arms are formed, for example, by providing a piezoelectric material between a pair of electrodes on a substrate made of silicon or the like.

The present inventors have found that when a temperature characteristics correction layer of, for example, a silicon oxide layer or the like is formed on a substrate in order to improve the temperature characteristics or the like of the substrate, the vibration arms warp due to the difference in the thickness or the coefficient of thermal expansion between the material for the substrate and the material for the temperature characteristics correction layer. As the vibration arms warp, the leading ends of the vibration arms may come into contact with the upper and lower substrates that form the vibration space of the resonator in a resonance device of which the size reduction is demanded for the application in a cellular phone or the like, for example.

Accordingly, the present disclosure has been made in view of this technical issue and is directed to preventing a vibration arm from making contact with upper and lower substrates even in a resonance device with a reduced size.

Thus, a resonance device is disclosed herein that includes a resonator, and an upper lid and a lower lid that oppose each other with the resonator interposed therebetween. The resonator includes a base portion, a plurality of vibration arms that include a piezoelectric material and a pair of electrode layers that oppose each other with the piezoelectric material interposed therebetween, that are connected at first ends to a front end of the base portion, and that extend in a direction away from the base portion, and a frame or holding portion provided in at least a portion of a periphery of the base portion and the vibration arms. Moreover, a holding arm is provided that is connected at one end to the base portion and connected at another end to the frame or holding portion at a side closer to other ends of the plurality of vibration arms than the one ends of the plurality of vibration arms. In the exemplary aspect, the base portion, the plurality of vibration arms, and the holding arm include a substrate and a temperature characteristics correction layer that is laminated on the substrate and that is made of a material having a coefficient of thermal expansion different from that of the substrate, and are formed integrally by the substrate and the temperature characteristics correction layer.

According to the present disclosure, even in a resonance device with a reduced size, a vibration arm can be prevented from making contact with upper and lower substrates.

6F illustrates an example of a process flow of the resonance device according to the first exemplary embodiment.

Figure 3:
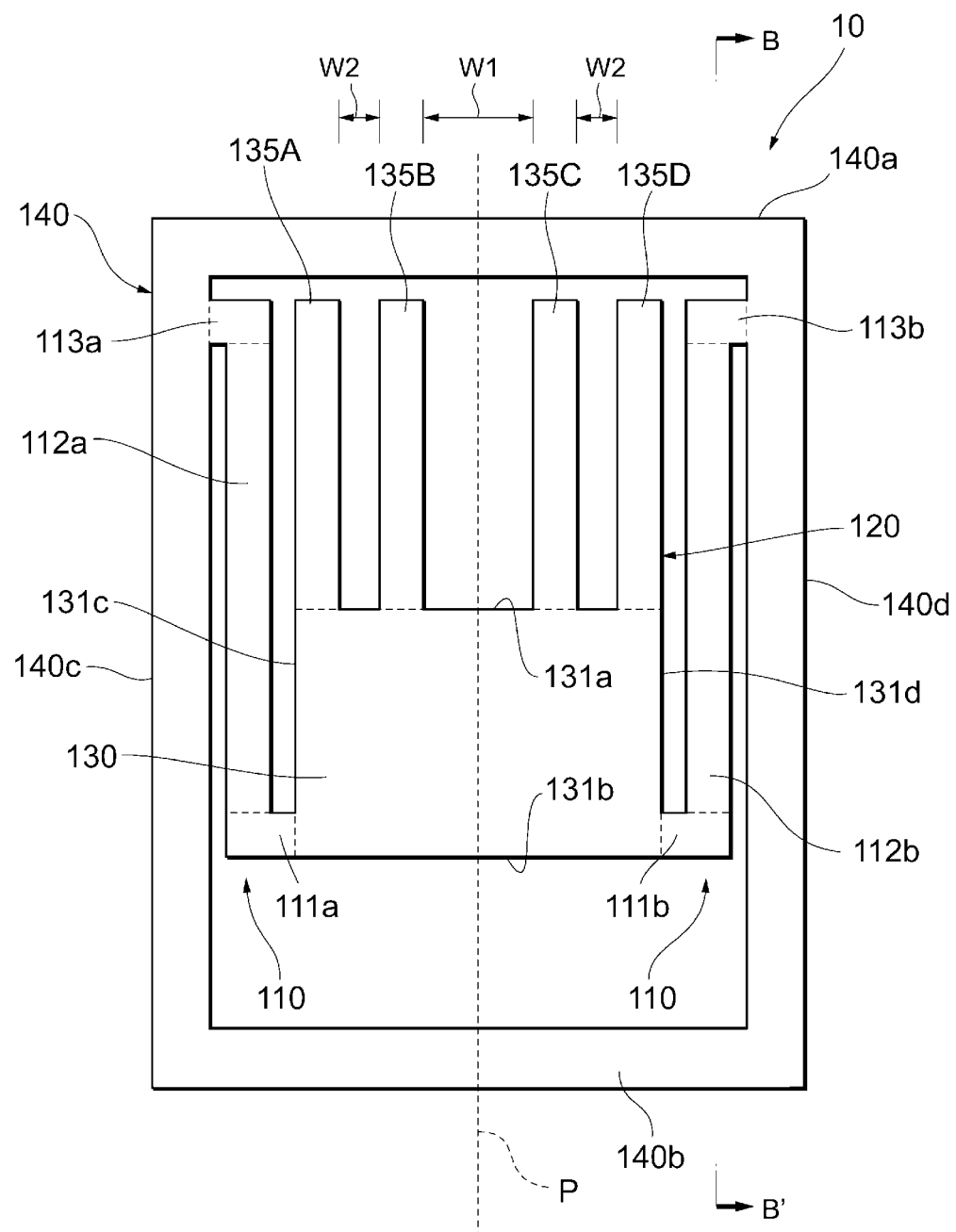
FIG. 3 is a plan view of a resonator according to the first exemplary embodiment, from which an upper side substrate is being removed.
Figure 7:
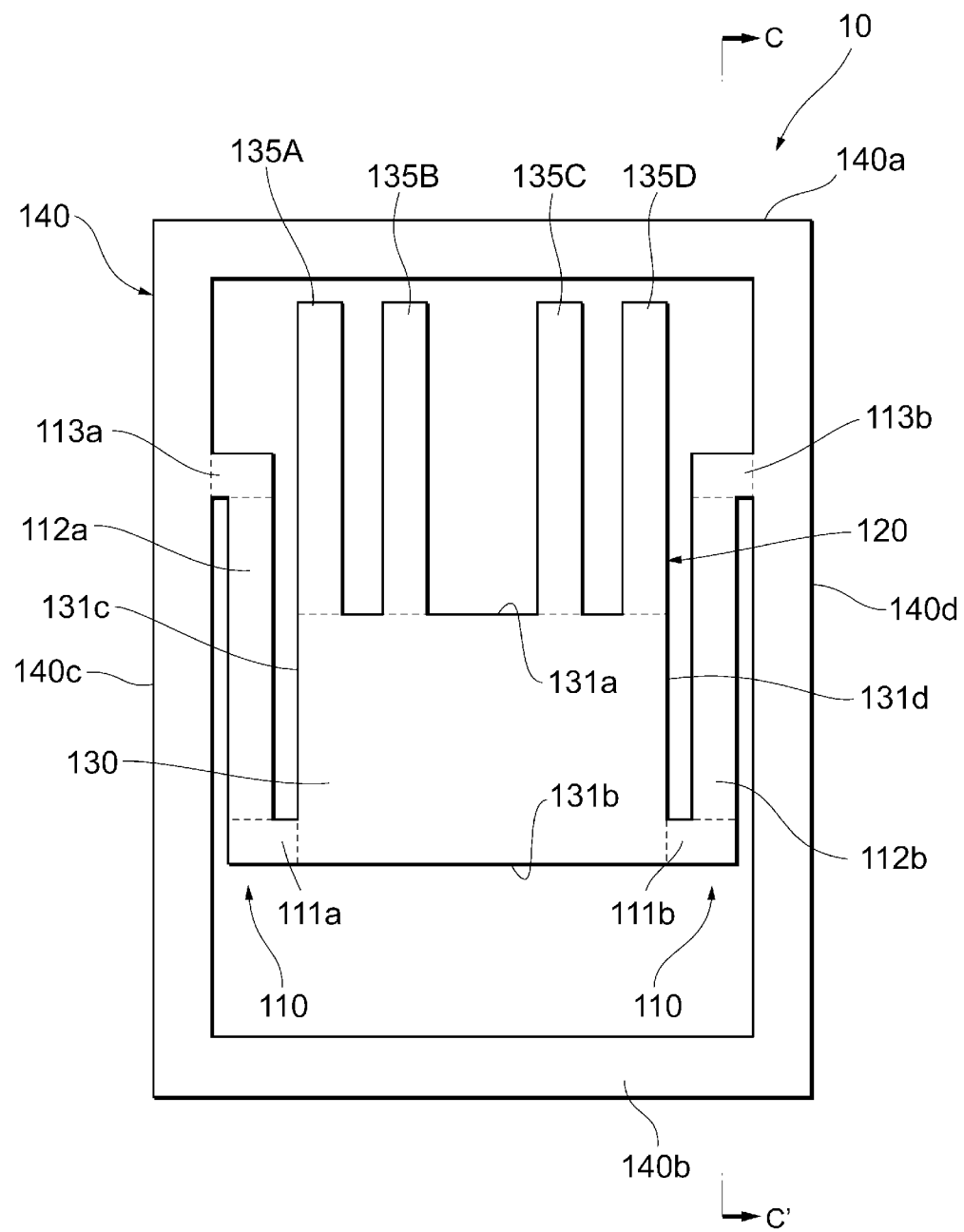

FIG. 7, which corresponds to FIG. 3, is a plan view of a resonator according to a second exemplary embodiment, from which an upper side substrate is being removed.

Figure 8:
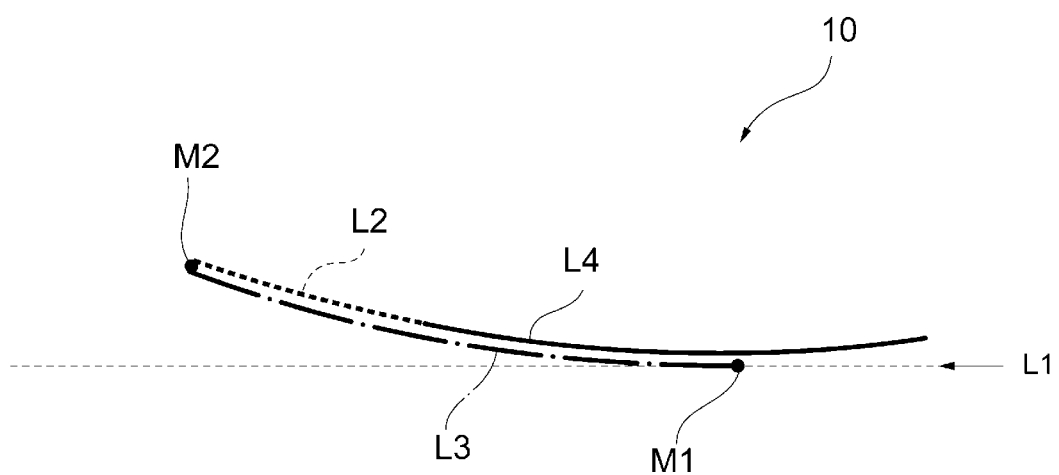

FIG. 8, which corresponds to FIG. 5, schematically illustrates a positional relationship among a holding portion, a vibration portion, and a holding arm according to the second exemplary embodiment.

Figure 9:
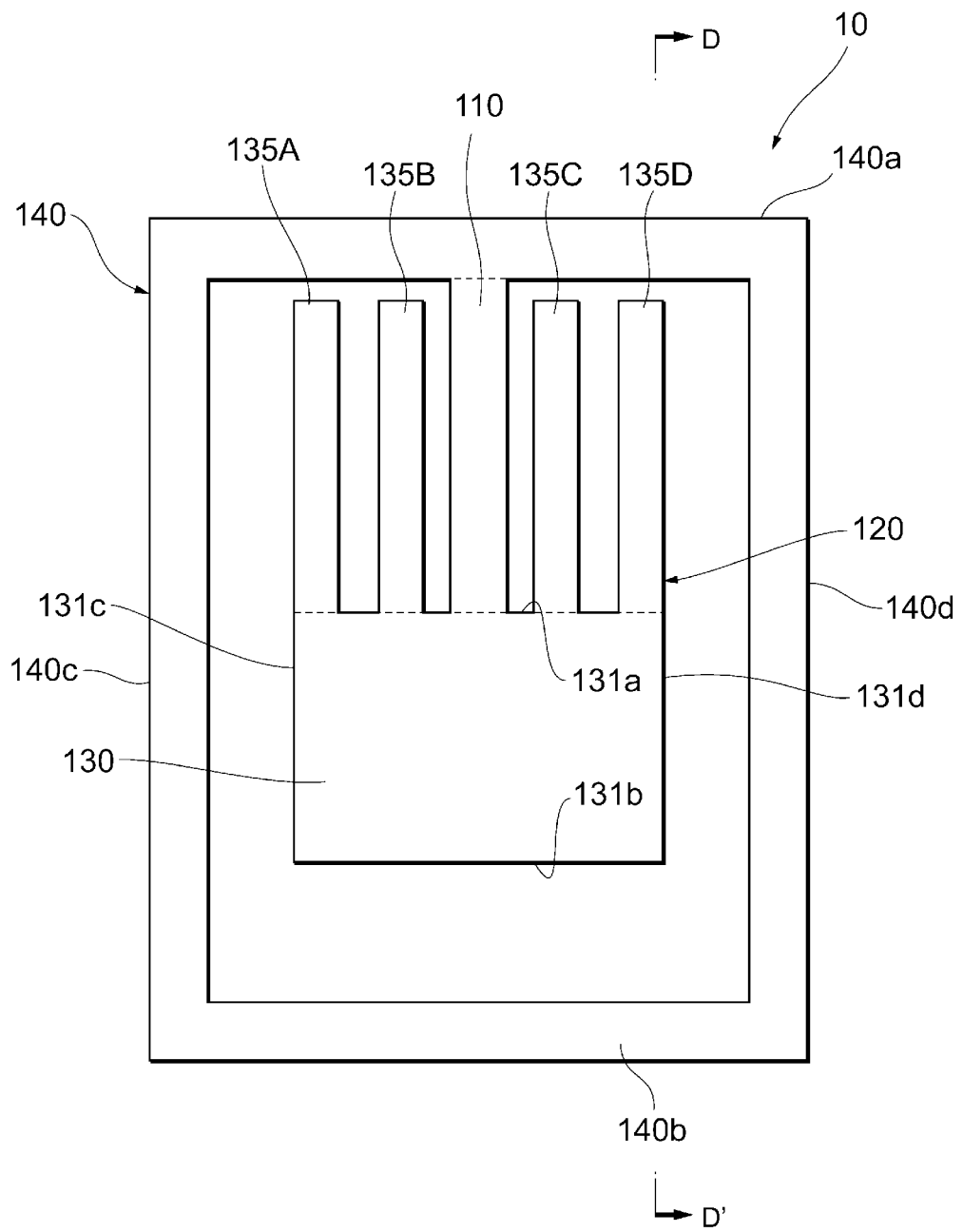

FIG. 9, which corresponds to FIG. 3, is a plan view of a resonator according to a third exemplary embodiment, from which an upper side substrate is being removed.

Figure 10:
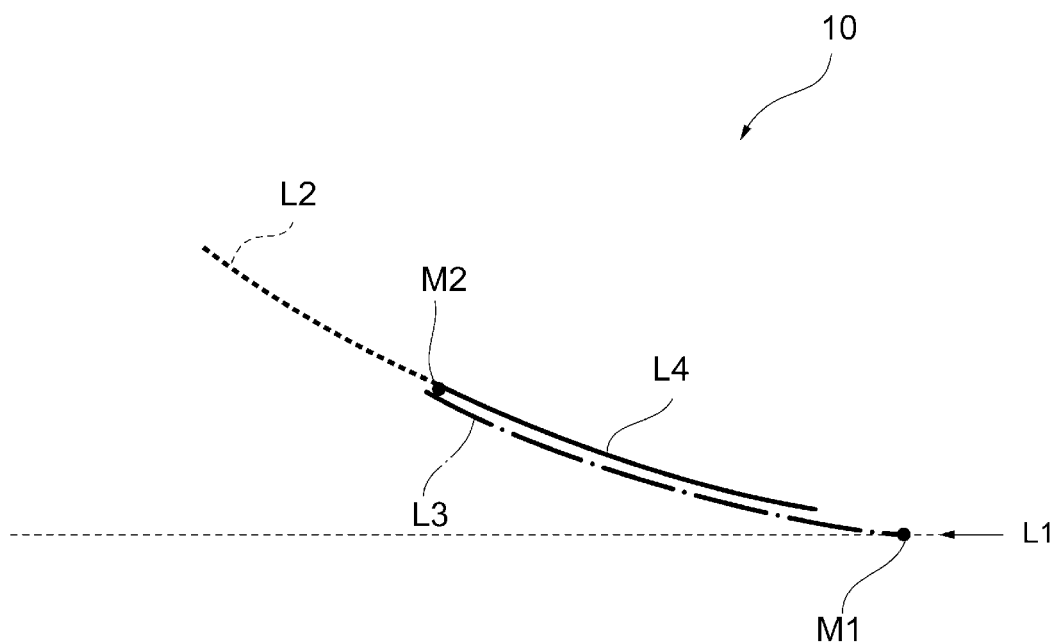

FIG. 10, which corresponds to FIG. 5, schematically illustrates a positional relationship among a holding portion, a vibration portion, and a holding arm according to the third exemplary embodiment.

Figure 11:
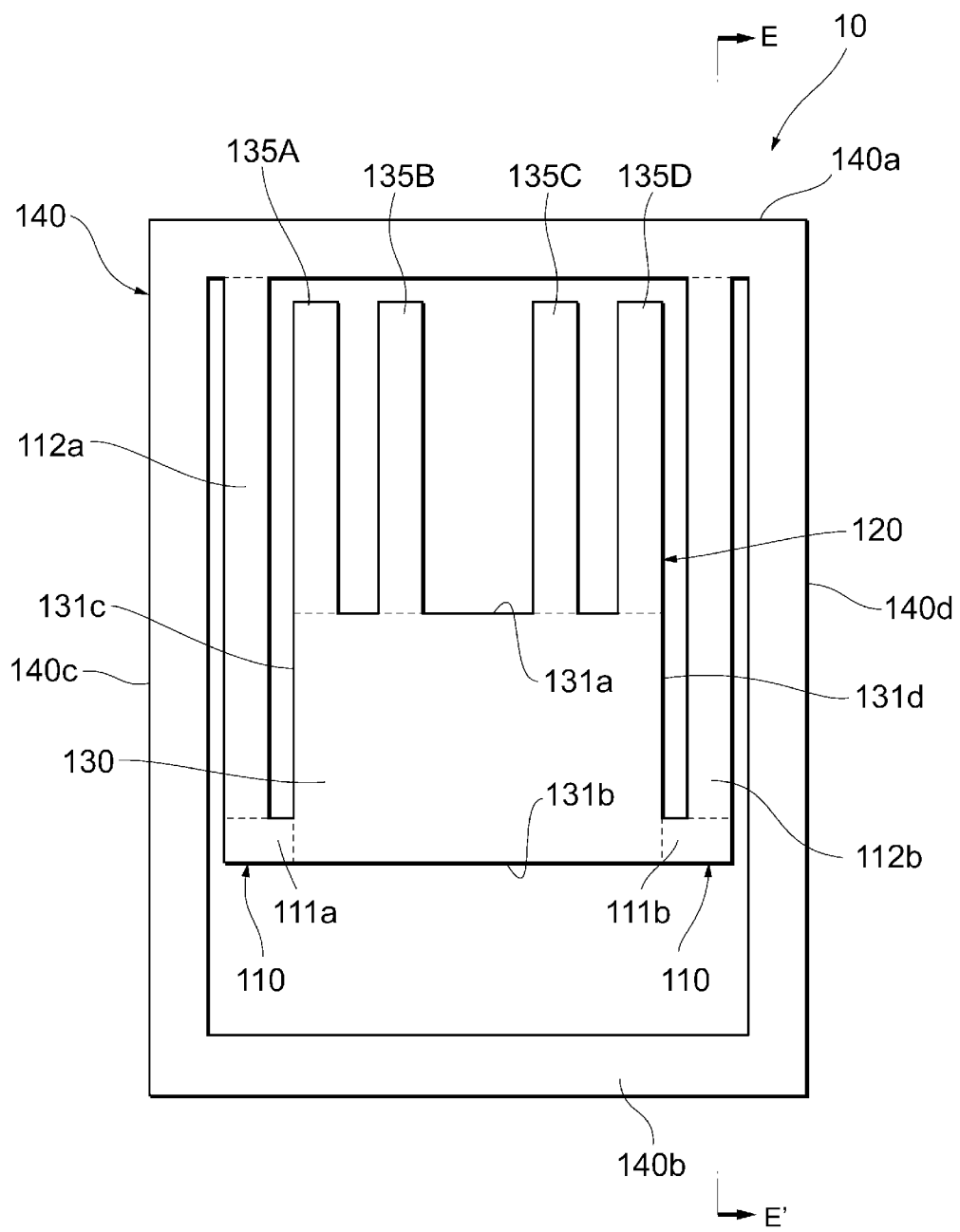
Figure 11:
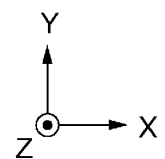

FIG. 11, which corresponds to FIG. 3, is a plan view of a resonator according to a fourth exemplary embodiment, from which an upper side substrate is being removed.

Figure 12:
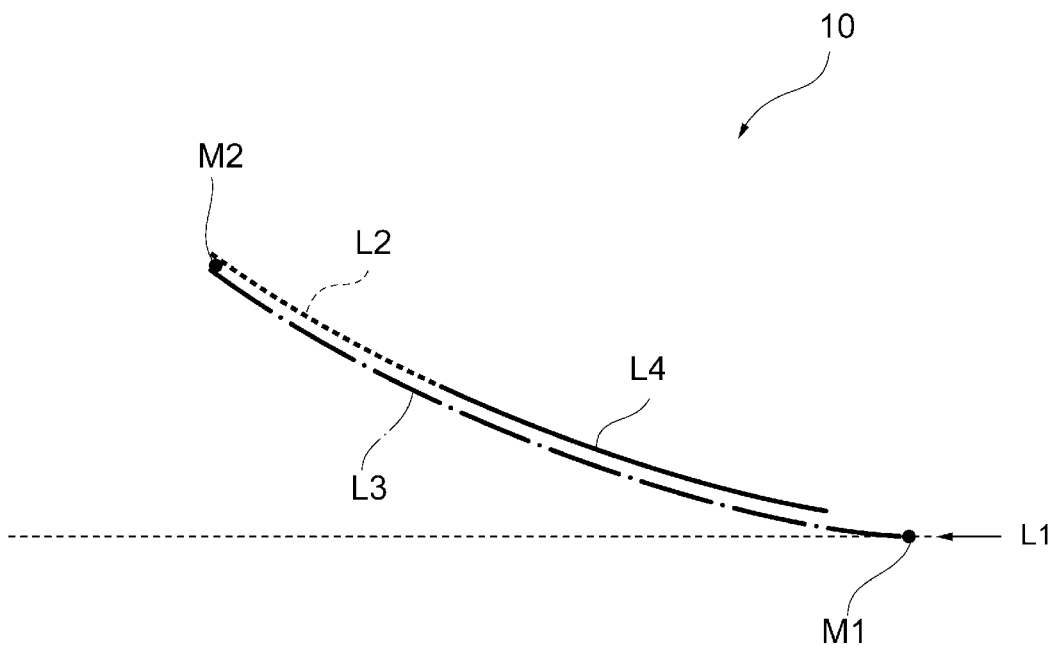

FIG. 12, which corresponds to FIG. 5, schematically illustrates a positional relationship among a holding portion, a vibration portion, and a holding arm according to the fourth exemplary embodiment.

Figure 13:
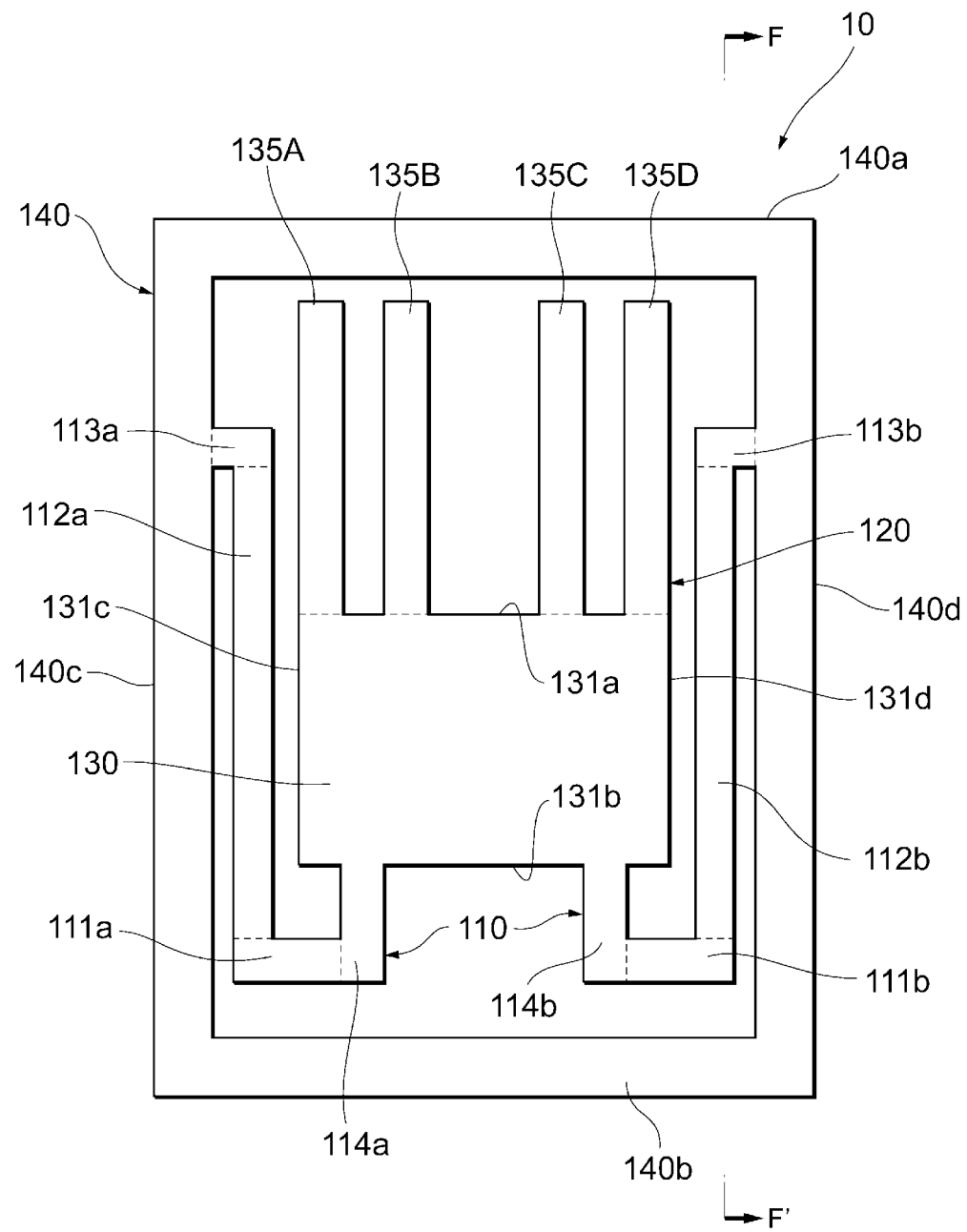

FIG. 13, which corresponds to FIG. 3, is a plan view of a resonator according to a fifth exemplary embodiment, from which an upper side substrate is being removed.

Figure 14:
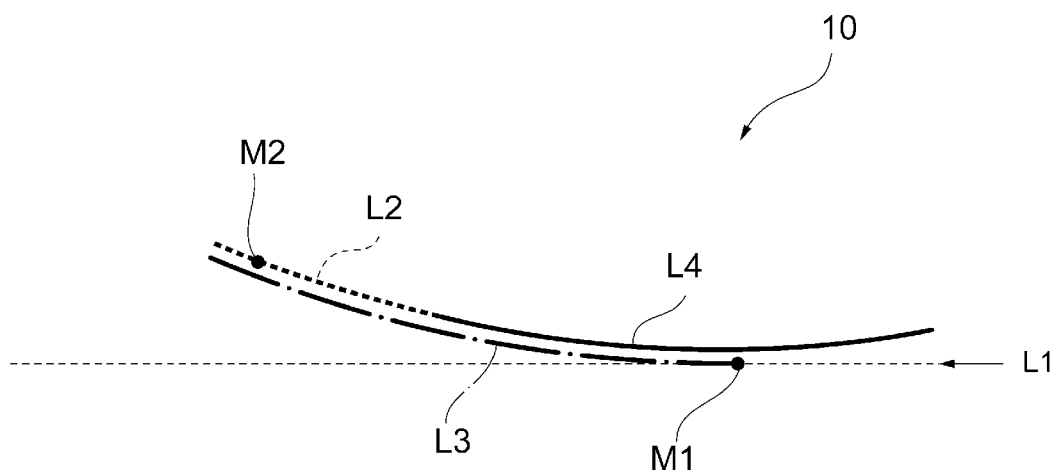

FIG. 14, which corresponds to FIG. 5, schematically illustrates a positional relationship among a holding portion, a vibration portion, and a holding arm according to the fifth exemplary embodiment.

Figure 15:
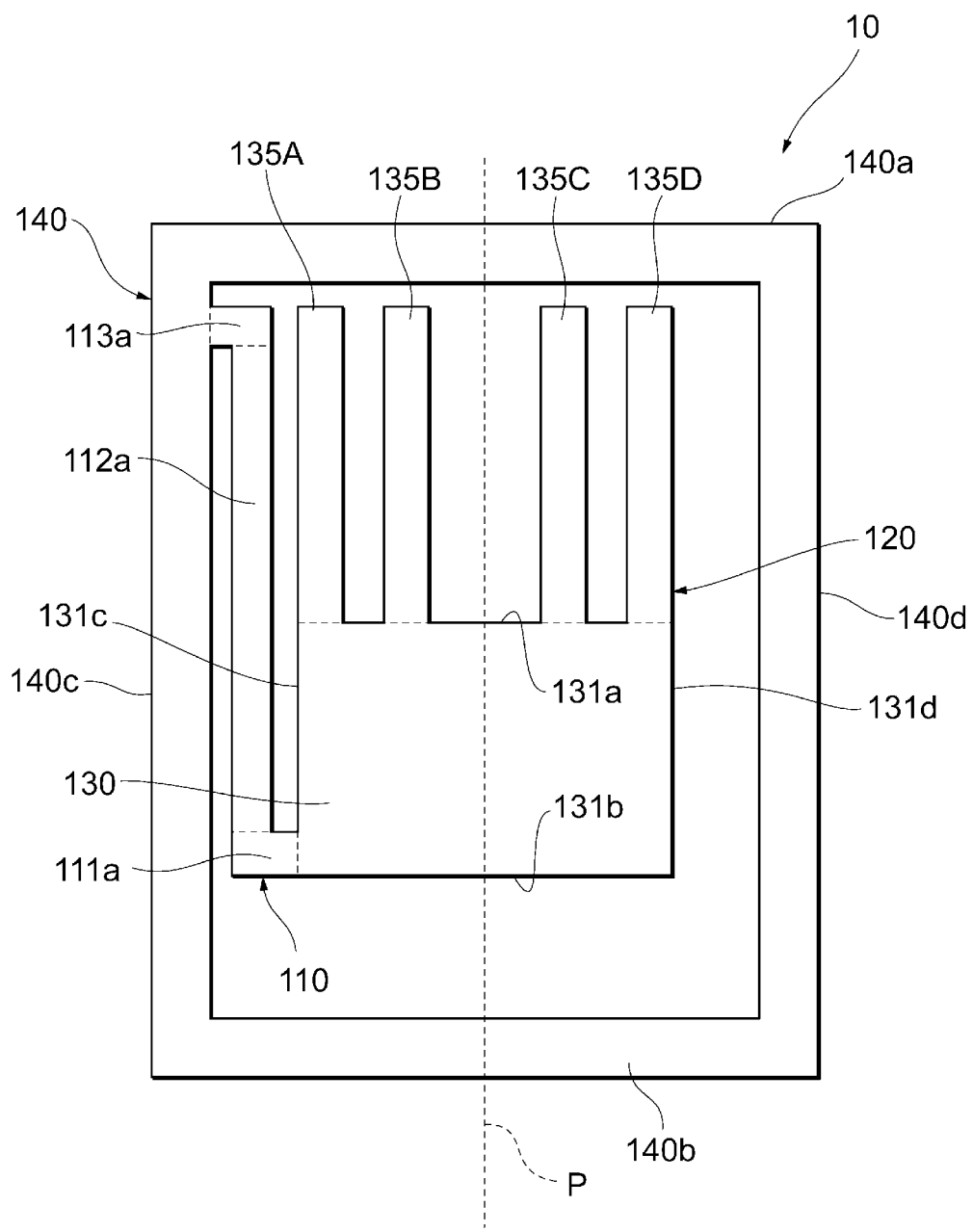
Figure 15:
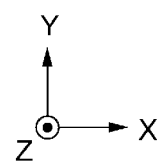

FIG. 15, which corresponds to FIG. 3, is a plan view of a resonator according to a sixth exemplary embodiment, from which an upper side substrate is being removed.

DETAILED DESCRIPTION OF EXEMPLARY EMBODIMENTS

First Embodiment

Figure 1:
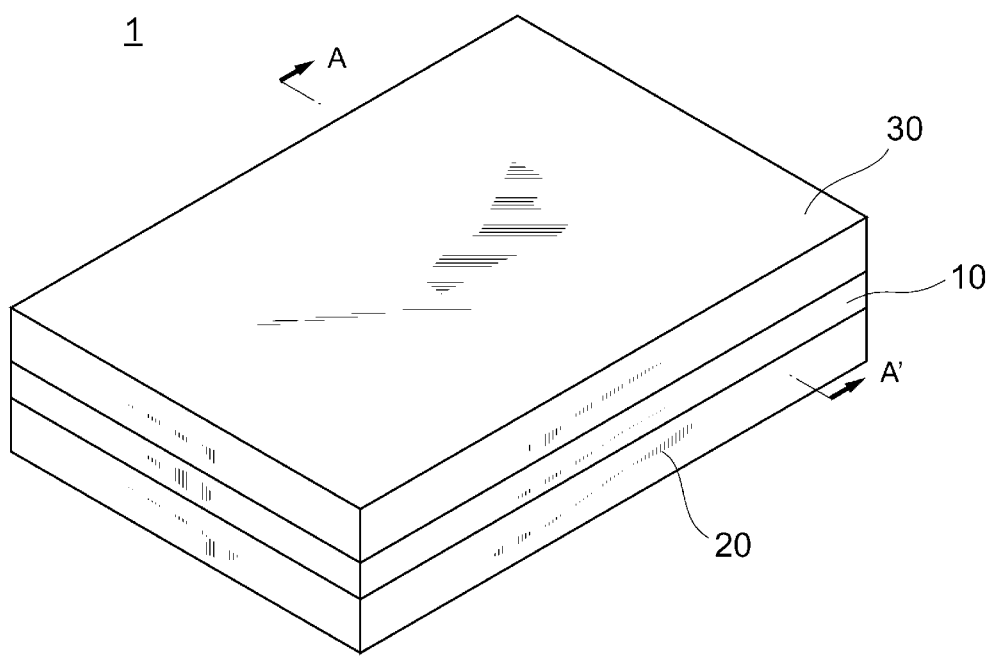
FIG. 1 is a perspective view schematically illustrating an appearance of a resonance device according to a first exemplary embodiment.
Figure 2:
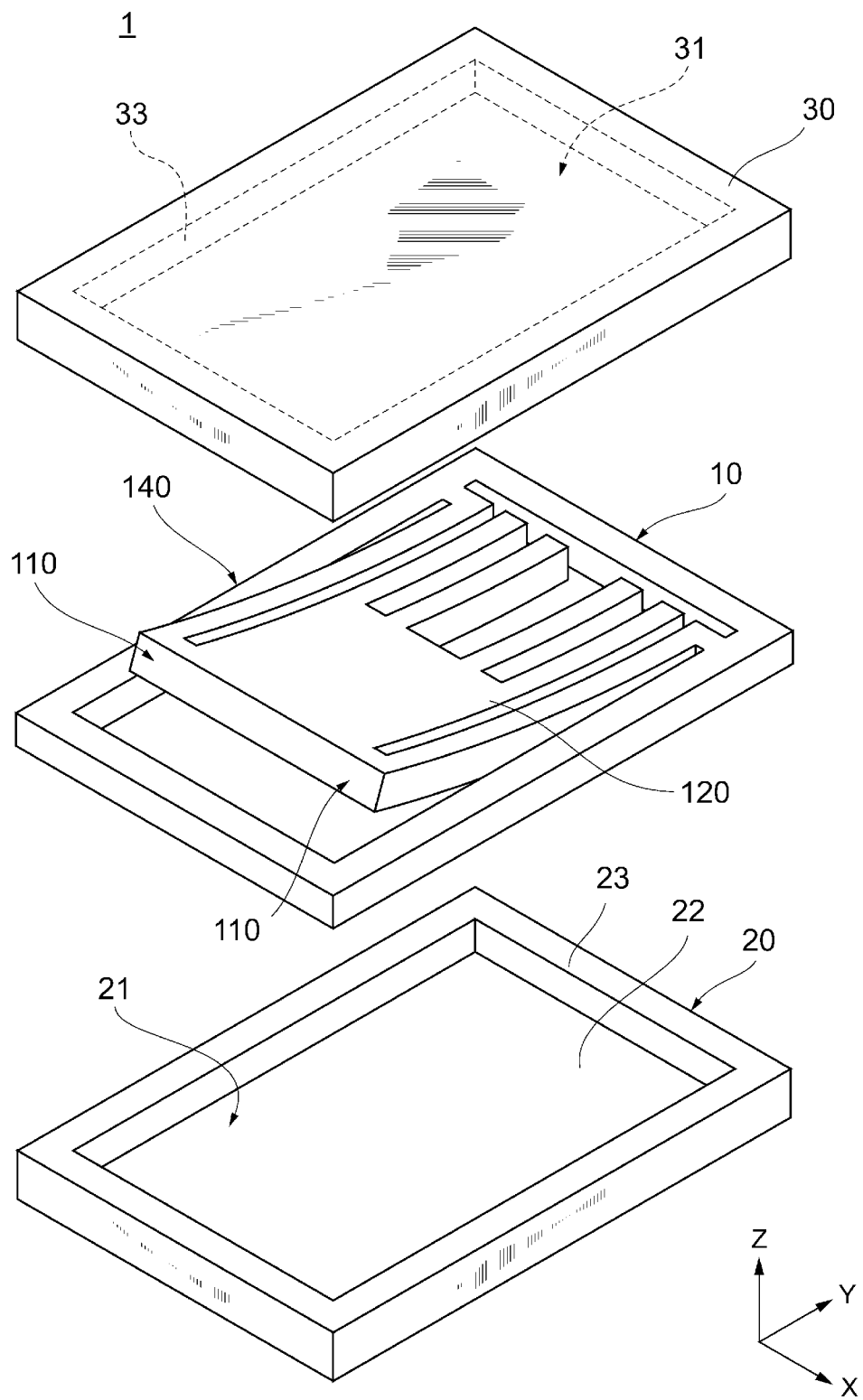
FIG. 2 is an exploded perspective view schematically illustrating a structure of the resonance device according to the first exemplary embodiment.

Hereinafter, a first embodiment will be described with reference to the appended drawings. FIG. 1 is a perspective view schematically illustrating an appearance of a resonance device 1 according to the first embodiment. In addition, FIG. 2 is an exploded perspective view schematically illustrating a structure of the resonance device 1 according to the first embodiment.

As shown, the resonance device 1 includes a resonator 10, and an upper lid 30 and a lower lid 20 that are provided so as to sandwich the resonator 10. In other words, the resonance device 1 is constituted as the lower lid 20, the resonator 10, and the upper lid 30 are laminated in this order.

In addition, as the resonator 10, the lower lid 20, and the upper lid 30 are bonded together in the exemplary embodiment, the resonator 10 is sealed, and the vibration space of the resonator 10 is formed. The resonator 10, the lower lid 20, and the upper lid 30 are each formed with the use of a Si substrate. In addition, as the Si substrates are bonded to each other, the resonator 10, the lower lid 20, and the upper lid 30 are bonded to each other. The resonator 10 and the lower lid 20 may be formed with the use of a SOI substrate in an exemplary aspect.

The resonator 10 is a MEMS resonator manufactured with the use of the MEMS technique. It is to be noted that, although the resonator 10 is described by way of an example that is formed with the use of a silicon substrate in the present embodiment, the resonator 10 may instead be formed with the use of a substrate of other than silicon, such as amorphous Si, SiC, SiGe, Ge, gallium arsenide, or crystal.

Hereinafter, each of the configurations of the resonance device 1 will be described in detail.

(1. Upper Lid 30)

The upper lid 30 extends in a planar shape along the XY plane, and a shallow, rectangular parallelepiped-shaped recess portion 31, for example, is formed in the back surface of the upper lid 30. The recess portion 31 is enclosed by a side wall 33 and forms a portion of the vibration space, which is the space in which the resonator 10 vibrates.

(2. Lower Lid 20)

The lower lid 20 includes a rectangular plate-shaped bottom plate 22 provided along the XY plane and a side wall 23 that extends in the Z-axis direction (i.e., in the lamination direction of the lower lid 20 and the resonator 10) from a peripheral portion of the bottom plate 22. In the lower lid 20, a recess portion 21 formed by a surface of the bottom plate 22 and an inner surface of the side wall 23 is provided in the surface that opposes the resonator 10. The recess portion 21 forms a portion of the vibration space of the resonator 10. With the upper lid 30 and the lower lid 20 described above, this vibration space is airtightly sealed and is retained in a vacuum state. This vibration space may be filled, for example, with a gas such as an inert gas.

(3. Resonator 10)

FIG. 3 is a plan view schematically illustrating a structure of the resonator 10 according to the present embodiment. With reference to FIG. 2 and FIG. 3, each of the configurations of the resonator 10 according to the present embodiment will be described. The resonator 10 includes a vibration portion 120, a holding portion 140, and a holding arm 110.

(a) Vibration Portion 120

The vibration portion 120 has a rectangular outline (i.e., shape) that extends along the XY plane in the orthogonal coordinate system of FIG. 3. The vibration portion 120 is provided in an inner side portion of the holding portion 140, and a space is formed between the vibration portion 120 and the holding portion 140 at a predetermined interval. As shown, the holding portion 140 is a rectangular frame and the terms frame and holding portion are used interchangeably herein. Moreover, in the example illustrated in FIG. 3, the vibration portion 120 includes a base portion 130 and four vibration arms 135A to 135D (also referred to collectively as the "vibration arms 135"). It is to be noted that the number of the vibration arms is not limited to four and is set to a desired number no smaller than two, for example, as should be appreciated to one skilled in the art.

As illustrated in FIG. 2, the base portion 130 is formed into a substantially rectangular parallelepiped shape that is curved in the Z-axis direction.

With reference to FIG. 3, the structure of the base portion 130 as viewed from the above will be described. The base portion 130 includes long sides 131a (an example of a front end) and 131b (an example of a rear end) that extend in the X-axis direction and short sides 131c and 131d that extend in the Y-axis direction. The base portion 130 is connected to the holding portion 140 with the holding arm 110, which will be described later, at the short sides 131c and 131d and is thus held. In the present embodiment, the length of the long sides 131a and 131b is set to approximately 245 µm, for example, and the length of the short sides 131c and 131d is set to approximately 110 µm, for example. It is to be noted that, although the base portion 130 has a substantially rectangular shape as viewed from the above in the example illustrated in FIG. 3, the shape is not limited thereto, and it suffices that the base portion 130 be formed into a shape that is substantially symmetric with respect to a plane defined along a perpendicular bisector of the long side 131a. The term "substantially" as used herein takes into account minor variations that may result from manufacturing differences, for example. In one example, the base portion 130 may be trapezoidal in which the long side 131b is shorter than the long side 131a or may have a semicircular shape with the long side 131a serving as the diameter. In addition, the long sides 131a and 131b and the short sides 131c and 131d are not limited to straight lines and may be curved lines.

As illustrated in FIG. 2, each of the vibration arms 135 (not numbered in FIG. 2) extends in the Y-axis direction, is formed into a substantially prism shape that curves in the Z-axis direction, and has an identical size. Specifically, the vibration arms 135 each have a three-dimensional shape that, as progressing from the free end toward the fixed end, gradually becomes spaced apart from the XY plane defined along the holding portion 140, which will be described later, in the Z-axis direction.

With reference to FIG. 3, the structure of the vibration arms 135 as viewed from the above will be described. The vibration arms 135 are each provided between the base portion 130 and the holding portion 140 so as to be parallel to the Y-axis direction. First ends of the vibration arms 135 are connected to the long side 131a of the base portion 130 to serve as the fixed ends, and the other (i.e., second and opposing) ends serve as the free ends. Furthermore, the vibration arms 135 are provided in parallel to each other at a predetermined interval in the X-axis direction. In the present embodiment, each of the vibration arms 135 is formed integrally with the base portion 130. It is to be noted that the vibration arms 135 each have, for example, a width of approximately 50 μm in the X-axis direction and a length of approximately 480 μm in the Y-axis direction.

In the vibration portion 120 according to the present embodiment, the two vibration arms 135A and 135D are disposed in the outer side portion in the X-axis direction, and the two vibration arms 135B and 135C are disposed in the inner side portion, relative to vibration arms 135A and 135D. An interval W1 (i.e., a distance or space) between the vibration arms 135B and 135C in the X-axis direction is set to be greater than an interval W2 between the vibration arm 135A (135D) in the outer side portion and the vibration arm 135B (135C) in the inner side portion adjacent to the vibration arm 135A (135D) in the outer side portion in the X-axis direction. The interval W1 is, for example, approximately 25 μm, and the interval W2 is, for example, approximately 10 μm. As the interval W2 is set to be smaller than the interval W1, the vibration characteristics are improved. In another exemplary aspect, the interval W1 may be set to be smaller than the interval W2 or may be set to be equal to the interval W2, so that the size of the resonance device 1 can be reduced.

(b) Holding Portion 140

The holding portion 140 is formed into a rectangular frame along the XY plane. The holding portion 140 is provided so as to surround the outer side portion of the vibration portion 120 along the XY plane as viewed from the above. It is to be noted that the holding portion 140 may be provided in at least a portion of the periphery of the vibration portion 120 and the shape is not limited to a rectangular frame shape. For example, in a variation, the holding portion 140 can be provided on the periphery of the vibration portion 120 such that the holding portion 140 can hold the vibration portion 120 and can be bonded to the upper lid 30 and the lower lid 20.

In the present embodiment, the holding portion 140 is formed by a plurality of frame members 140a to 140d. It is to be noted that, as illustrated in FIG. 2, the frame members 140a to 140d have a prism shape that is formed integrally.

With reference to FIG. 3, the structure of the holding portion 140 as viewed from the above in the plan view will be described. As illustrated in FIG. 3, the frame member 140a is provided so as to oppose the free second ends of the vibration arms 135 such that the lengthwise direction of the frame member 140a is parallel to the X-axis. The frame member 140b is provided so as to oppose the long side 131b of the base portion 130 such that the lengthwise direction of the frame member 140b is parallel to the X-axis. The frame member 140c is provided so as to oppose a long side of an arm 112a of the holding arm 110, which will be described later, such that the lengthwise direction of the frame member 140c is parallel to the Y-axis, and the two ends of the frame member 140c are connected to respective ends of the respective frame members 140a and 140b. The frame member 140d is provided so as to oppose a long side of an arm 112b of the holding arm 110, which will be described later, such that the lengthwise direction of the frame member 140d is parallel to the Y-axis, and the two ends of the frame member 140d are connected to the other respective ends of the respective frame members 140a and 140b.

It is to be noted that, in the following description, the side toward the frame member 140a is referred to as the upper side of the resonator 10 and the side toward the frame member 140b is referred to as the lower side of the resonator 10.

(c) Holding Arm 110

The holding arm 110 is provided in the inner side portion of the holding portion 140 and connects the short sides 131c and 131d of the base portion 130 to the frame members 140c and 140d.

As illustrated in FIGS. 2 and 3, the holding arm 110 includes prism plate-shaped arms 111a, 112a, 113a and prism plate-shaped arms 111b, 112b, and 113b that are each formed integrally and are curved in the Z-axis direction. Specifically, the arm 112a has a three-dimensional shape that gradually becomes spaced apart from the XY plane defined along the holding portion 140 in the Z-axis direction, as progressing from a portion connected to the arm 113a toward a portion connected to the arm 111a. In a similar manner, the arm 112b has a three-dimensional shape that gradually becomes spaced apart from the XY plane defined along the holding portion 140 in the Z-axis direction, as progressing from a portion connected to the arm 113b toward a portion connected to the arm 111b. In addition, in the example illustrated in FIG. 2, the YZ plane that passes through the center of the arm 112a in the X-axis direction is provided so as to be parallel to the YZ plane that passes through the center of the frame member 140c. In a similar manner, the YZ plane that passes through the center of the arm 112b in the X-axis direction is provided so as to be parallel to the YZ plane that passes through the center of the frame member 140d.

With reference to FIG. 3, the structure of the holding arm 110 as viewed from the above will be described. In the present embodiment, the holding arm 110 is formed so as to be substantially symmetric with respect to a virtual plane P defined to be parallel to the YZ plane along the center line of the base portion 130 in the X-axis direction.

As shown, the arm 111a is provided between the base portion 130 and the frame member 140c so as to oppose the frame member 140b such that the lengthwise direction of the arm 111a is parallel to the X-axis. The arm 111a is connected at one end to the base portion 130 at the short side 131c of the base portion 130 and extends therefrom so as to be substantially perpendicular to the short side 131c, or in other words, extends in the X-axis direction. The other end of the arm 111a is connected at a side surface thereof (a surface on the XZ plane) to one end of the arm 112a. The arm 111a has a width defined in the Y-axis direction of approximately 20 μm and a length defined in the X-axis direction of 40 μm according to an exemplary aspect.

In addition, the arm 112a is provided between the base portion 130 and the frame member 140c so as to oppose the frame member 140c such that the lengthwise direction of the arm 112a is parallel to the Y-axis. In addition, the other end of the arm 112a is connected to one end of the arm 113a on a side surface of a side that opposes the frame member 140c. The arm 112a, for example, has a width defined in the X-axis direction of approximately 20 μm and a length defined in the Y-axis direction of approximately 550 μm according to an exemplary aspect.

The arm 113a is provided between the vibration arm 135A and the frame member 140c so as to oppose the frame member 140a such that the lengthwise direction of the arm 113a is parallel to the X-axis. The other end of the arm 113a is connected to the frame member 140c in the vicinity of a region in the frame member 140c that opposes the free end of the vibration arm 135A. In other words, the other end of the arm 113a is fixed to the frame member 140c on a side of the vibration arm 135A. The arm 113a, for example, has a width defined in the Y-axis direction of approximately 20 μm and a length defined in the X-axis direction of approximately 40 μm. It is to be noted that the configuration of the arms 111b, 112b, and 113b is similar to the configuration of the arms 111a, 112a, and 113a.

As described thus far, the holding arm 110 according to the present embodiment is connected to the base portion 130 at first ends of the arms 111a and 111b, is bent at portions at which the side surfaces on the other ends of the arms 111a and 111b are connected to the arms 112a and 112b, is bent again at portions at which the arms 112a and 112b are connected to the arms 113a and 113b, and is then connected to the holding portion 140. In this manner, as the holding arm 110 according to the present embodiment has a configuration in which the holding arm 110 is bent, the holding arm 110 can hold the base portion 130 without interfering with the flexural displacement of the base portion 130. As a result, a rise in the frequency in large-amplitude driving can be reduced. Consequently, the resonator 10 according to the present embodiment can suppress a shift in the resonant frequency. Furthermore, in the present embodiment, the holding arm 110 is connected to the frame members 140c and 140d of the holding portion 140 in the regions on the sides of the vibration arms 135. In other words, in the resonance device 1 according to the present embodiment, the holding arm 110 is not provided between the free ends of the vibration arms 135 and the frame member 140a of the holding portion 140. With this configuration, the size of the resonance device 1 in the lengthwise direction of the vibration arms 135 can be reduced.

It is to be noted that the shape of the holding arm 110 is not limited to the one in which the holding arm 110 is bent at a right angle at portions at which the arms are connected to each other. The holding arm 110 may have a shape in which the holding arm 110 is curved at portions at which the arms are connected to each other.

(4. Lamination Structure)

Figure 4:
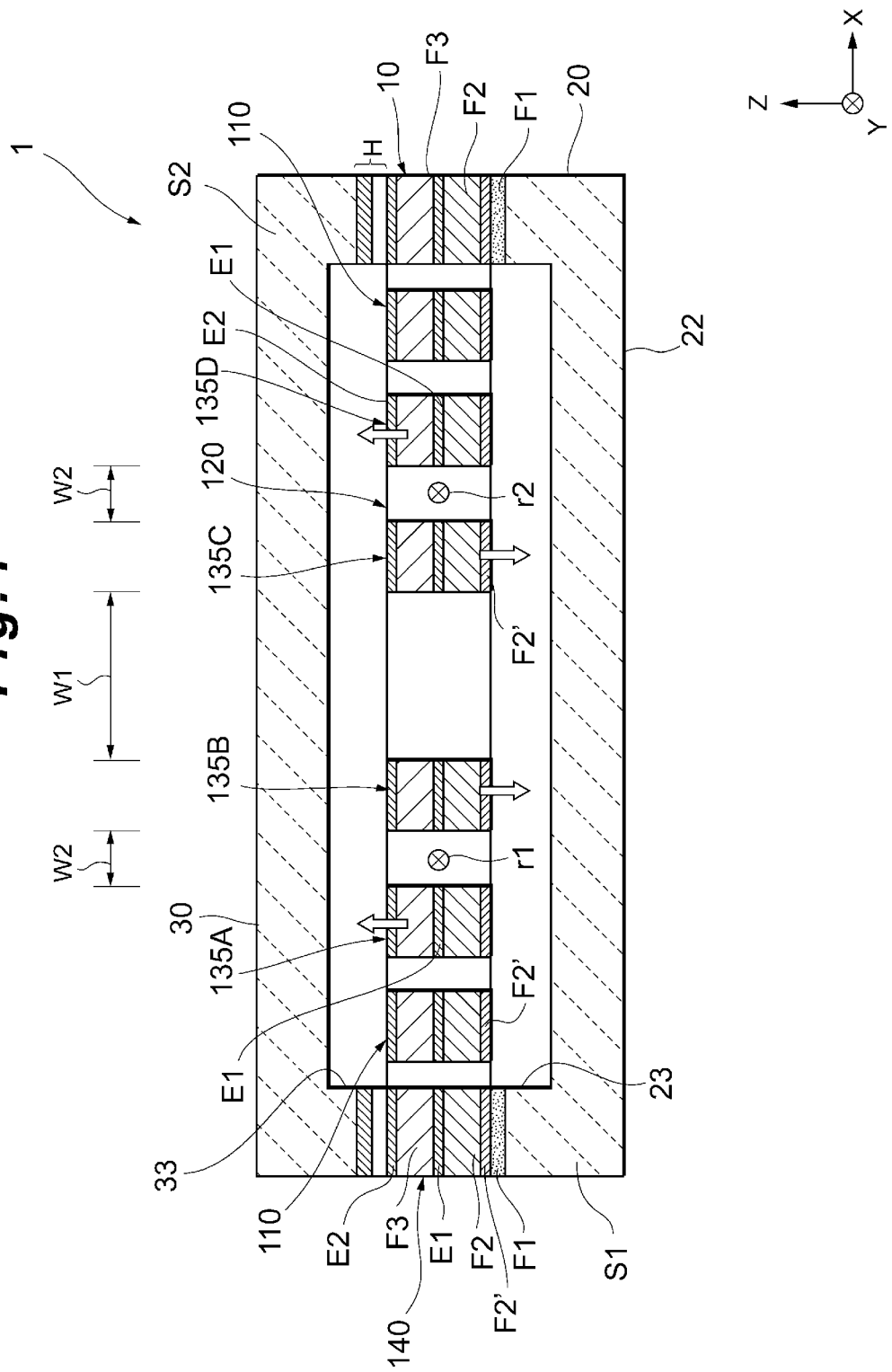
FIG. 4 is a sectional view taken along the AA' line indicated in FIG. 1.

With reference to FIG. 4, the lamination structure of the resonance device 1 will be described. FIG. 4 is a sectional view taken along AA' indicated in FIG. 1.

As illustrated in FIG. 4, in the resonance device 1 according to the present embodiment, the holding portion 140 of the resonator 10 is bonded to the side wall 23 of the lower lid 20, and the holding portion 140 of the resonator 10 and the side wall 33 of the upper lid 30 are bonded to each other. In this manner, as the resonator 10 is held between the lower lid 20 and the upper lid 30, and the vibration space in which the vibration arms 135 vibrate is formed by the lower lid 20, the upper lid 30, and the holding portion 140 of the resonator 10.

The bottom plate 22 and the side wall 23 of the lower lid 20 are formed integrally of a Si (silicon) wafer S1 according to an exemplary aspect. Moreover, a silicon oxide (e.g., $SiO_2$ (silicon dioxide)) film F1 is formed on the upper surface of the side wall 23, and the lower lid 20 and the holding portion 140 of the resonator 10 are bonded to each other with the stated silicon oxide film F1. The thickness of the lower lid 20 defined in the Z-axis direction is, for example, 150 μm, and the depth of the recess portion 21 is, for example, 50 μm.

The upper lid 30 is formed of a Si (silicon) wafer S2 having a predetermined thickness in the exemplary embodiment. As illustrated in FIG. 4, the upper lid 30 is bonded to the holding portion 140 of the resonator 10 at a peripheral portion (the side wall 33) of the upper lid 30. A bonding portion H is formed between the peripheral portion of the upper lid 30 and the holding portion 140 in order to bond the upper lid 30 and the holding portion 140 to each other. The bonding portion H is formed, for example, of a Au (gold) film and a Sn (tin) film.

In the resonator 10, the holding portion 140, the base portion 130, the vibration arms 135, and the holding arm 110 are formed integrally through the same process. In the resonator 10, first, a metal layer E1 is laminated on a Si (silicon) substrate F2 (an example of a substrate). Then, a piezoelectric thin film F3 (an example of a piezoelectric material) is laminated on the metal layer E1 so as to cover the metal layer E1, and a metal layer E2 is further laminated on the piezoelectric thin film F3. It should be appreciated that the metal layer E1 may be either laminated directly on Si substrate F2 or indirectly with a seed layer in between, as would be appreciated to one skilled in the art.

The Si substrate F2 is formed, for example, of a degenerated n-type Si semiconductor having a thickness of approximately 10 μm and can include, as an n-type dopant, P (phosphorus), As (arsenic), Sb (antimony), or the like. The resistance value of the degenerated Si used for the Si substrate F2 is desirably no less than 0.5 mΩ·cm nor greater than 0.9 mΩ·cm. The resistance value of the degenerated Si used in the present embodiment is, for example, 0.63 mΩ·cm. Furthermore, a silicon oxide (e.g., $SiO_2$) layer F2' (an example of a temperature characteristics correction layer) is formed on the lower surface of the Si substrate F2. With this configuration, the temperature characteristics can be improved.

In the present embodiment, at least the base portion 130, the vibration arms 135, and the holding arm 110 are formed integrally of the same Si substrate F2 and the same silicon oxide layer F2'.

In the present embodiment, the temperature characteristics correction layer refers to a layer having a function of reducing, at least at around the normal temperature, the temperature coefficient of the frequency (i.e., the rate of change with respect to the temperature) in the vibration portion when the temperature characteristics correction layer is formed on the Si substrate F2 as compared to a case in which the temperature characteristics correction layer is not formed on the Si substrate F2. As the vibration portion 120 includes the temperature characteristics correction layer, for example, the change in the resonant frequency, associated with the change in the temperature, of the laminated structural body of the Si substrate F2, the metal layers E1 and E2, the piezoelectric thin film F3, and the silicon oxide layer (temperature characteristics correction layer) F2' can be reduced.

In the resonator 10 of the exemplary embodiment, it is desirable that the silicon oxide layer F2' be formed to have a uniform thickness. It is to be noted that the uniform thickness means that the variation in the thickness of the silicon oxide layer F2' is within ±20% from the mean value of the thickness.

It is to be noted that the silicon oxide layer F2' may be formed on the upper surface of the Si substrate F2 or may be formed on both the upper surface and the lower surface of the Si substrate F2.

In addition, in the holding portion 140, the silicon oxide layer F2' does not need to be formed on the lower surface of the Si substrate F2.

In addition, the metal layers E2 and E1 are formed, for example, with the use of Mo (molybdenum), aluminum (Al), or the like to a thickness of approximately 0.1 μm. It is to be noted that, as the degenerated Si is used for the Si substrate F2, the Si substrate F2 can also serve as the metal layer E1.

The metal layers E2 and E1 are formed into a desired shape through etching or the like. The metal layer E1 is formed so as to function as a lower electrode (an example of an electrode layer), for example, on the vibration portion 120. In addition, the metal layer E1 is formed, on the holding arm 110 or the holding portion 140, so as to function as a wire for connecting the lower electrode to an alternating current power source provided outside the resonator 10.

On the other hand, the metal layer E2 is formed so as to function as an upper electrode (an example of an electrode layer) on the vibration portion 120. In addition, the metal layer E2 is formed, on the holding arm 110 or the holding portion 140, so as to function as a wire for connecting the upper electrode to an alternating current power source provided outside the resonator 10.

It is to be noted that, for the connection of the alternating current power source to a lower wire or an upper wire, a configuration in which an electrode is formed on the outer surface of the upper lid 30 and this electrode connects the alternating current power source to the lower wire or the upper wire or a configuration in which a via is formed in the upper lid 30, the inside of this via is filled with a conductive material to provide a wire, and this wire connects the alternating current power source to the lower wire or the upper wire may be employed.

The piezoelectric thin film F3 is a thin film of a piezoelectric material that converts an applied voltage to a vibration and can, for example, contain, as a primary component, a nitride such as AlN (aluminum nitride) or an oxide. Specifically, the piezoelectric thin film F3 can be formed of ScAlN (scandium aluminum nitride). ScAlN is obtained by replacing a part of aluminum in aluminum nitride with scandium. In addition, the piezoelectric thin film F3 has a thickness of, for example, 1 μm.

The piezoelectric thin film F3 expands and contracts in the in-plane direction of the XY plane, or in other words, in the Y-axis direction in accordance with the electric field applied to the piezoelectric thin film F3 by the metal layers E2 and E1. The expansion and contraction of the piezoelectric thin film F3 displaces the free ends of the vibration arms 135 toward the inner surfaces of the lower lid 20 and the upper lid 30, and the vibration arms 135 vibrate in the out-of-plane flexural vibration mode.

In the present embodiment, the phase of the electric field applied to the vibration arms 135A and 135D in the outer side portion and the phase of the electric field applied to the vibration arms 135B and 135C in the inner side portion are set to be mutually opposite phases. With this configuration, the vibration arms 135A and 135D in the outer side portion and the vibration arms 135B and 135C in the inner side portion are displaced in mutually opposite directions. For example, when the free ends of the vibration arms 135A and 135D in the outer side portion are displaced toward the inner surface of the upper lid 30, the free ends of the vibration arms 135B and 135C in the inner side portion are displaced toward the inner surface of the lower lid 20.

In the resonance device 1 configured as described above, during the vibrations in opposite phase, specifically, the vibration arm 135A and the vibration arm 135B illustrated in FIG. 4 vibrate in vertically opposite directions about a center axis r1 extending parallel to the Y-axis between the vibration arm 135A and the vibration arm 135B. In addition, the vibration arm 135C and the vibration arm 135D vibrate in vertically opposite directions about a center axis r2 extending parallel to the Y-axis between the vibration arm 135C and the vibration arm 135D. Thus, the twisting moments in mutually opposite directions are generated at the center axes r1 and r2, and the flexural vibration is produced at the base portion 130.

(5. Section Structure)

Figure 5A:
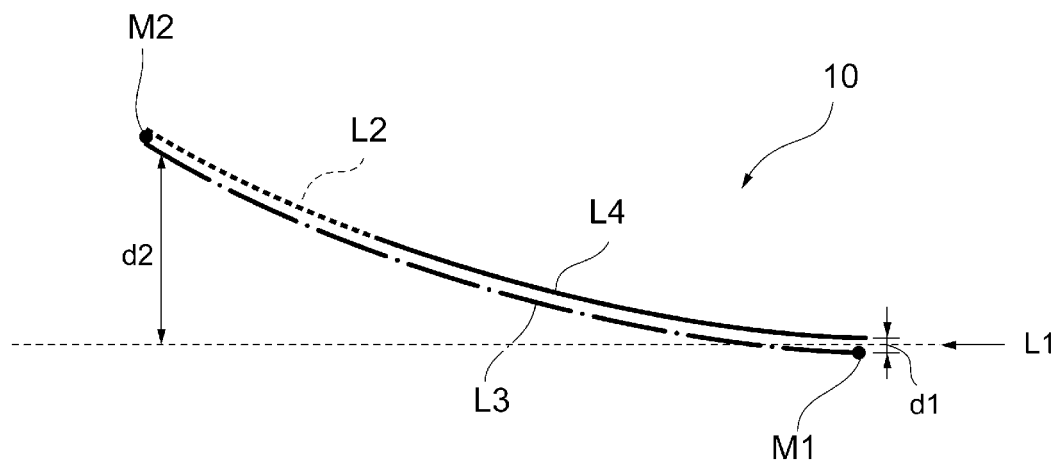
FIG. 5A schematically illustrates a positional relationship among a holding portion, a vibration portion, and a holding arm according to the first exemplary embodiment.
Figure 5B:
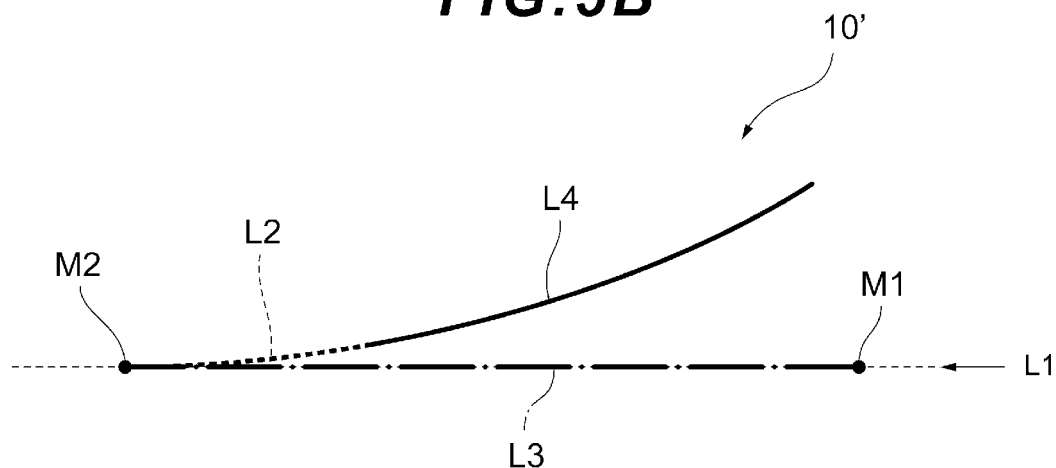
FIG. 5B schematically illustrates a positional relationship among a holding portion, a vibration portion, and a holding arm according to a comparative example of the first exemplary embodiment.

FIGS. 5A and 5B schematically illustrate the positional relationship among the vibration arms 135, the holding arm 110, and the holding portion 140 on the section along BB' indicated in FIG. 3. Specifically, FIG. 5A is a sectional view of the resonator 10 according to the present embodiment, and FIG. 5B is a sectional view of a resonator 10' according to a comparative example.

In FIGS. 5A and 5B, the dashed line indicates a surface L1 (i.e., the surface that makes contact with the silicon oxide layer F2' in FIG. 4, an example of a first surface) of the Si substrate F2 of the holding portion 140 that opposes the lower lid 20. In addition, the solid line indicates a surface L4 (i.e., the surface that makes contact with the silicon oxide layer F2' in FIG. 4, an example of a fourth surface) of the Si substrate F2 of the vibration arms 135 that opposes the lower lid 20, the dotted line indicates a surface L2 (i.e., the surface that makes contact with the silicon oxide layer F2' in FIG. 4, an example of a second surface) of the Si substrate F2 of the base portion 130 that opposes the lower lid 20, and the dashed-dotted line indicates a surface L3 (i.e., the surface that makes contact with the silicon oxide layer F2' in FIG. 4, an example of a third surface) of the Si substrate F2 of the holding arm 110 that opposes the lower lid 20. In addition, a point M1 indicates a portion at which the holding arm 110 and the holding portion 140 are connected to each other, and a point M2 indicates a portion at which the holding arm 110 and the base portion 130 are connected to each other.

The resonator 10' according to the comparative example includes the silicon oxide layer F2' on the lower surface of the Si substrate F2 in the vibration portion 120 but, unlike the resonator 10 according to the present embodiment, does not include the silicon oxide layer F2' on the lower surface of the Si substrate F2 in the holding arm 110.

Silicon and silicon oxide are materials with different coefficients of thermal expansion. Therefore, when the silicon oxide layer F2' is laminated on the Si substrate F2 in a predetermined site of the resonator 10, this site takes a warped shape due to the stress. Herein, "to warp" refers to a state in which a surface of the Si substrate F2 (the surface that opposes the lower lid 20) in the site in which the silicon oxide layer F2' is laminated on the Si substrate F2 has a portion that does not lie in the same plane as a surface of the Si substrate F2 (the surface that opposes the lower lid 20) in a site in which the silicon oxide layer F2' is not laminated. Furthermore, in the present embodiment, "to warp" refers to a state in which a site that is curved at a predetermined curvature is included.

As illustrated in FIG. 5B, in the resonator 10' according to the comparative example, a holding arm 110' does not include the silicon oxide layer F2', and thus the section of the holding arm 110' does not take a warped shape. Therefore, the surface L3 of the holding arm 110' extends in the same plane as the surface L1 along the surface L1 of a holding portion 140'. On the other hand, a vibration portion 120' includes the silicon oxide layer F2', and thus a base portion 130' and vibration arms 135' take a warped shape. Therefore, the surface L2 of the base portion 130' gradually becomes spaced apart from the surface L1, as progressing from the point M2 of the base portion 130' toward the front end. Furthermore, the surface L4 of the vibration arms 135' gradually becomes spaced apart from the surface L1, as progressing from the fixed ends of the vibration arms 135 toward the free ends thereof.

On the other hand, in the resonator 10 according to the present embodiment, the silicon oxide layer F2' is formed on the Si substrate F2 in the holding arm 110 as well. Therefore, in the resonator 10 according to the present embodiment, the holding arm 110 takes a shape that is warped at a curvature similar to that of the vibration portion 120. In other words, in the resonator 10 according to the present embodiment, the sections of the surface L2 and the surface L4 substantially match the section of the surface L3 in terms of their shapes and their positions in the Z-direction. Specifically, as illustrated in FIG. 5A, of the surface L3 in the holding arm 110, the point M2 of the holding arm 110 does not lie on the surface L1. To be more specific, the surface L3 of the holding arm 110 has a shape that gradually becomes spaced apart from the surface L1 of the holding portion 140, as progressing from the point M1 toward the portion at which the holding arm 110 is connected to the base portion 130 (point M2). Therefore, the holding arm 110 is provided above the surface L1, or in other words, in the inside of the recess portion 31 (the depiction is omitted in FIG. 5) in the upper lid 30 (the depiction is omitted in FIG. 5).

On the other hand, of the surface L2 in the base portion 130, the rear end does not lie on the surface L1. To be more specific, the surface L2 of the base portion 130 has a shape that gradually approaches the surface L1, as progressing from the point M2 toward the front end. Therefore, the base portion 130 is provided above the surface L1, or in other words, in the inside of the recess portion 31 (the depiction is omitted in FIG. 5) in the upper lid 30 (the depiction is omitted in FIG. 5).

In addition, of the surface L4 in the vibration arms 135, a portion corresponding to the fixed ends of the vibration arms 135 does not lie on the surface L1. To be more specific, the surface L4 of the vibration arms 135 has a shape that approaches the surface L1, as progressing from the fixed ends of the vibration arms 135 toward the free ends thereof, and in which the surface L4 is located in substantially the same plane as the surface L1 at the free ends. Therefore, the vibration arms 135 are provided above the surface L1, or in other words, in the inside of the recess portion 31 (the depiction is omitted in FIG. 5) in the upper lid 30 (the depiction is omitted in FIG. 5).

In this manner, in the resonance device 1 according to the present embodiment, the Si substrate F2 has the silicon oxide layer F2' of which the thickness is adjusted to be substantially uniform in the vibration arms 135 and the holding arm 110, and the holding arm 110 is connected to the holding portion 140 on a side closer to a region that opposes the leading ends of the free ends than a region that opposes the fixed ends of the vibration arms 135 (i.e., the frame member 140a). Thus, the amounts of warping of the holding arm 110 and the vibration arms 135 are adjusted to be substantially the same, and this can reduce the amount of displacement of the free ends of the vibration arms 135 from the surface L4 of the holding portion 140.

Furthermore, in the present embodiment, the holding arm 110 is connected to the holding portion 140 in a region that opposes a side closer to the free ends than the vicinity of the middle of the vibration arms 135 in the lengthwise direction, or to be more specific, is connected to a region that opposes the leading ends of the free ends of the vibration arms 135 (i.e., the frame member 140a), and thus the amount of displacement of the free ends of the vibration arms 135 from the holding portion 140 can be brought close to zero.

Furthermore, in the resonator 10 according to the present embodiment, a distance d1 between a portion of the surface L4 of the vibration arms 135 corresponding to the free ends and the surface L1 of the holding portion 140 is smaller than a distance d2 between a portion of the surface L2 of the base portion 130 corresponding to the rear end of the base portion 130 and the surface L1. With this configuration, even in a case in which the vibration arms 135 undergo an out-of-plane flexural vibration, the free ends of the vibration arms 135 can be prevented from hitting the lower lid 20 or the upper lid 30.

Furthermore, in the present embodiment, the lengths of the base portion 130, the holding arm 110, and the vibration arms 135 along the Y-axis direction are set such that the length of the arms 111a and 111b from the front end of the base portion 130 to the end portions that are closest to the frame member 140b (i.e., the length, 110 μm, of the base portion 130 in the Y-axis direction) is shorter than the length of the vibration arms 135 in the lengthwise direction (i.e., 480 μm). With this configuration, even in a case in which the thickness of the silicon oxide layer F2' in the resonator 10 slightly varies (approximately ±20% from the mean value of the thickness), a variation in the amount of warping of the vibration arms 135 and the holding arm 110 can be reduced.

In addition, in the resonance device 1 according to the present embodiment, the portion having a warped shape in the resonator 10 (e.g., the base portion 130, the vibration arms 135, and the holding arm 110) is provided so as to be located in the inner side portion of one of the recess portion 31 in the upper lid 30 and the recess portion 21 in the lower lid 20. With this configuration, it suffices that, the recess portion in one of the lower lid 20 and the upper lid 30 in the inner side portion of which the resonator 10 is provided in the resonance device 1 according to the present embodiment be formed to be deeper, and an unwanted increase in the size can be suppressed.

(6. Process Flow)

FIG. 6 illustrates an example of a process flow of the resonator 10 according to the present embodiment. It is to be noted that, although FIG. 6 illustrates a single resonance device 1 among a plurality of resonance devices 1 formed in a wafer for simplicity, in a similar manner to a typical MEMS process, the resonance device 1 is obtained by forming a plurality of resonance devices 1 in a single wafer and then dividing the stated wafer.

Figure 6A:
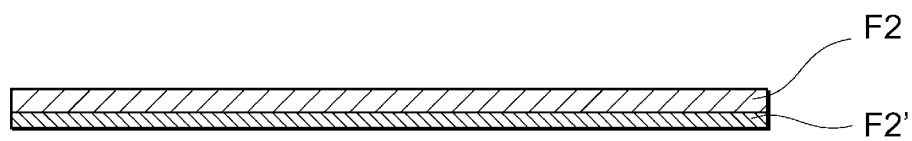
FIG. 6A illustrates an example of a process flow of the resonance device according to the first exemplary embodiment.

In the first step illustrated in FIG. 6A, the silicon oxide layer F2' is formed on a prepared Si substrate F2 through thermal oxidation. It is to be noted that the silicon oxide layer F2' may instead be formed through sputtering or deposition such as CVD.

Figure 6B:
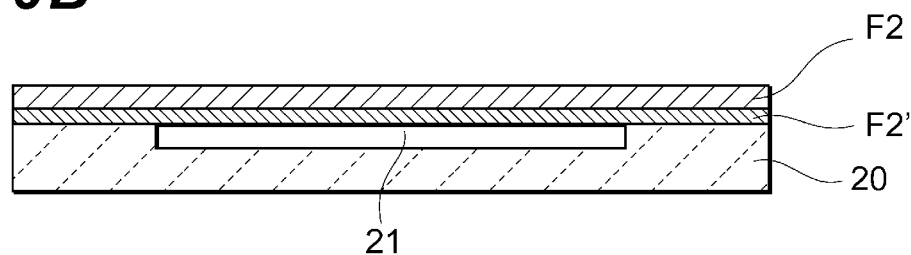
FIG. 6B illustrates an example of a process flow of the resonance device according to the first exemplary embodiment.

Next, in the step illustrated in FIG. 6B, the lower lid 20 having the recess portion 21 and the Si substrate F2 on which the silicon oxide layer F2' is formed are bonded to each other at the side wall 23. It is to be noted that, although the depiction is omitted in FIG. 6, it is desirable that the surface of the Si substrate F2 be planarized after the bonding through a process such as chemical mechanical polishing or etch-back.

Furthermore, the metal layer E1 is laminated on the surface of the Si substrate F2. The metal layer E1 may be formed to have a desired shape through a process such as etching.

Figure 6C:
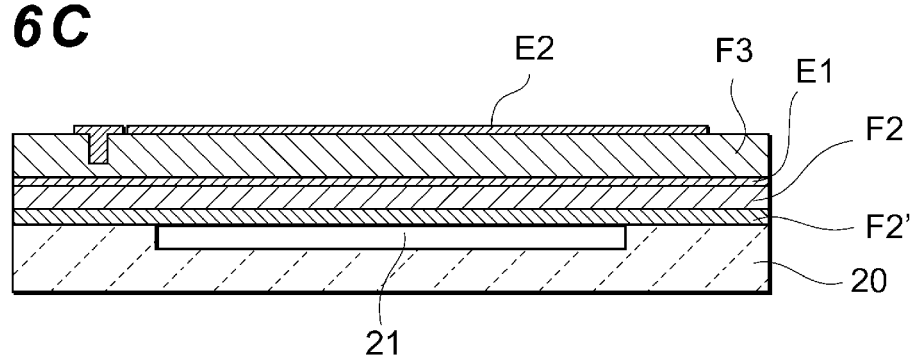
FIG. 6C illustrates an example of a process flow of the resonance device according to the first exemplary embodiment.

Next, the piezoelectric thin film F3 and the metal layer E2 are laminated in this order on the surface of the metal layer E1. The metal layer E2 is formed to have a desired shape through a process such as etching after having been laminated (FIG. 6C).

Figure 6D:
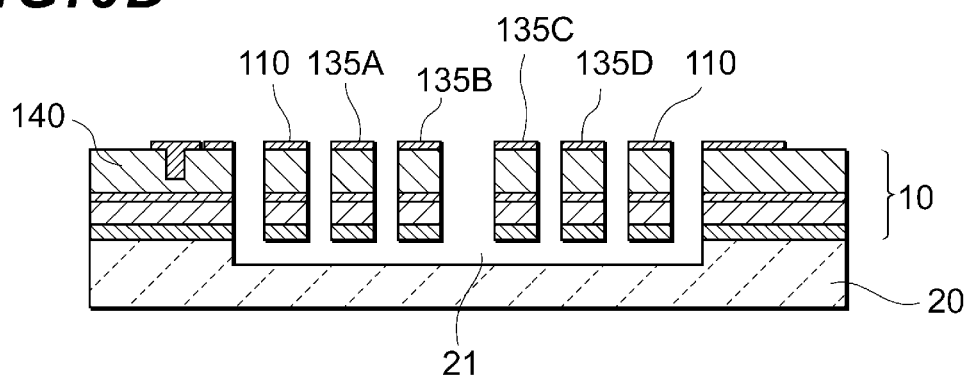
FIG. 6D illustrates an example of a process flow of the resonance device according to the first exemplary embodiment.

Furthermore, as the metal layer E2, the piezoelectric thin film F3, the metal layer E1, the Si substrate F2, and the silicon oxide layer F2' are removed sequentially through a process such as etching, the vibration arms 135A to 135D, the holding arm 110, and the base portion 130 (the depiction is omitted in FIG. 6) are formed, and the resonator 10 is formed (FIG. 6D).

Figure 6E:
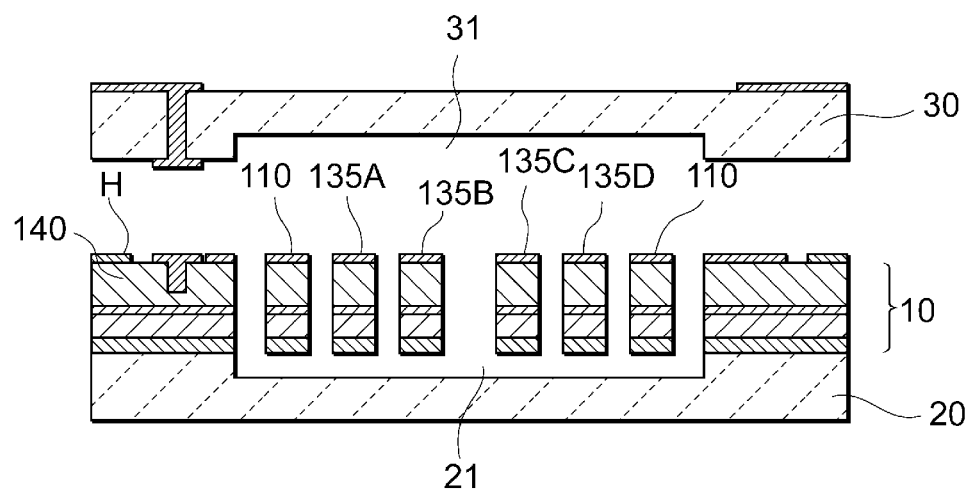
FIG. 6E illustrates an example of a process flow of the resonance device according to the first exemplary embodiment.
Figure 6F:
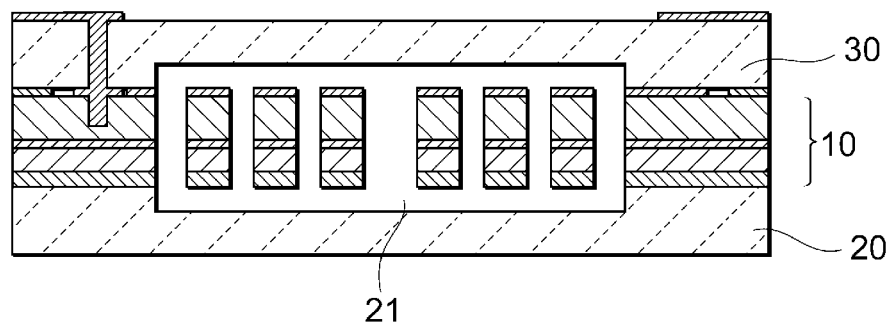

Next, in the step illustrated in FIG. 6E, the bonding portion H is formed on the holding portion 140. Furthermore, the upper lid 30, which has been positioned such that the recess portion 31 in the upper lid 30 coincides with the recess portion 21 in the lower lid 20, is bonded with the bonding portion H interposed therebetween (FIG. 6F).

Second Embodiment

In second and subsequent embodiments, descriptions of the features that are common to those of the first embodiment will be omitted, and only the differences will be described. In particular, similar effects obtained through similar configurations will not be noted in every embodiment.

FIG. 7 illustrates an example of a plan view of a resonator 10 according to the present embodiment. Hereinafter, among the detailed configurations of a resonance device 1 according to the present embodiment, the description centers on the differences from the first embodiment.

In the present embodiment, the length of the holding arm 110 defined in the Y-axis direction is shorter than the length of the holding arm 110 according to the first embodiment. Specifically, the arms 112a and 112b according to the present embodiment each have a length defined in the Y-axis direction of approximately 330 µm, for example. In addition, the arms 113a and 113b according to the present embodiment connect to the frame members 140c and 140d, respectively, in the regions that oppose the vicinity of the middle of the vibration arms 135A and 135D in the Y-axis direction.

Other configurations of the holding arm 110 are similar to those of the first embodiment.

FIG. 8 illustrates a relationship among the vibration arms 135, the holding arm 110, and the holding portion 140 on the section along CC' indicated in FIG. 7.

As illustrated in FIG. 8, in the present embodiment, the surface L4 of the vibration arms 135 has a shape that approaches the surface L1 of the holding portion 140, as progressing from the fixed ends of the vibration arms 135 toward the vicinity of the middle of the vibration arms 135 in the lengthwise direction (the region that opposes the point M1). Furthermore, the surface L4 has a shape that becomes spaced apart from the surface L1, as progressing from the vicinity of the middle of the vibration arms 135 in the lengthwise direction toward the free ends thereof.

It is to be noted that the relationship between the surfaces L2 and L3 and the surface L1 is similar to that of the first embodiment.

In the present embodiment, the configuration is such that the holding arm 110 connects to the holding portion 140 at the regions that oppose the vicinity of the middle of the vibration arms 135 in the lengthwise direction. In this case, the amount of displacement of the free ends of the vibration arms 135 from the holding portion 140 is reduced to approximately 50% of the amount of displacement of the free ends of the vibration arms 135' from the holding portion 140' of the resonator 10' of the comparative example illustrated in FIG. 5B.

Other configurations and functions are similar to those of the first embodiment.

Third Embodiment

In third and subsequent embodiments, descriptions of the features that are common to those of the first embodiment will be omitted, and only the differences will be described. In particular, similar effects obtained through similar configurations will not be noted in every embodiment.

FIG. 9 illustrates an example of a plan view of a resonator 10 according to the present embodiment. Hereinafter, among the detailed configurations of a resonance device 1 according to the present embodiment, the description centers on the differences from the first embodiment.

In the present embodiment, the holding arm 110, without being bent, connects the vicinity of the middle of the frame member 140a in the X-axis direction to the vicinity of the middle of the long side 131a of the base portion 130 in the X-axis direction (i.e., a region between the vibration arm 135B and the vibration arm 135C). In the present embodiment, the length of the holding arm 110 defined in the Y-axis direction is approximately 500 µm.

Other configurations of the holding arm 110 are similar to those of the first embodiment.

FIG. 10 illustrates a relationship among the vibration arms 135, the holding arm 110, and the holding portion 140 on the section along DD' indicated in FIG. 9.

As illustrated in FIG. 10, in the present embodiment, the surface L2 of the base portion 130 has a shape that gradually becomes spaced apart from the surface L1 of the holding portion 140, as progressing from the point M2 (i.e., the front end of the base portion 130) toward the rear end of the base portion 130. In addition, the surface L4 of the vibration arms 135 has a shape that approaches the surface L1, as progressing from the fixed ends of the vibration arms 135 toward the free ends thereof, but is not located in the same plane as the surface L1 even at the free ends.

It is to be noted that the relationship between the surface L3 and the surface L1 is similar to that of the first embodiment.

In the present embodiment, the configuration is such that the holding arm 110 connects to the front end of the base portion 130. Therefore, although the holding arm 110 connects to the frame member 140a, the length of the holding arm in the lengthwise direction is shorter than the length of the holding arm 110 according to the first embodiment. As a result, in the resonator 10 according to the present embodiment, the amount of displacement of the free ends of the vibration arms 135 from the holding portion 140 can be brought close to substantially zero but is greater than the amount of displacement in the first embodiment.

Other configurations and functions are similar to those of the first embodiment.

Fourth Embodiment

FIG. 11 illustrates an example of a plan view of a resonator 10 according to the present embodiment. Hereinafter, among the detailed configurations of a resonance device 1 according to the present embodiment, the description centers on the differences from the first embodiment.

In the present embodiment, the holding arm 110 according to the present embodiment does not include configurations corresponding to the arms 113a and 113b of the first embodiment and connects to the frame member 140a at the arms 112a and 112b. The holding arm 110 connects the short sides 131c and 131d of the base portion 130 to the frame member 140a of the holding portion 140. The length of the arms 112a and 112b defined in the Y-axis direction is approximately 590 μm.

Other configurations of the holding arm 110 are similar to those of the first embodiment.

FIG. 12 illustrates a relationship among the vibration arms 135, the holding arm 110, and the holding portion 140 on the section along EE' indicated in FIG. 11.

As illustrated in FIG. 12, in the present embodiment, the surface L4 of the vibration arms 135 has a shape that approaches the surface L1 of the holding portion 140, as progressing from the fixed ends of the vibration arms 135 toward the free ends thereof, and in which the surface L4 is located in substantially the same plane as the surface L1 at the free ends.

It is to be noted that the relationship between the surface L3 and the surface L1 is similar to that of the first embodiment.

In the present embodiment, the configuration is such that the holding arm 110 connects the short sides 131c and 131d of the base portion 130 to the frame member 140a. Therefore, in the resonator 10 according to the present embodiment, the amount of displacement of the free ends of the vibration arms 135 from the holding portion 140 can be brought close to substantially zero.

Other configurations and functions are similar to those of the first embodiment.

Fifth Embodiment

FIG. 13 illustrates an example of a plan view of a resonator 10 according to the present embodiment. Hereinafter, among the detailed configurations of a resonance device 1 according to the present embodiment, the description centers on the differences from the first embodiment.

In the present embodiment, the holding arm 110 includes arms 114a and 114b (examples of a sub-arm) in addition to the arms 111a to 113a and 111b to 113b and connects the rear end of the base portion 130 to the frame members 140c and 140d.

The arm 114a is provided between the base portion 130 and the frame member 140b such that the lengthwise direction of the arm 114a is parallel to the Y-axis. The arm 114a is connected at one end (i.e., a first end) to the base portion 130 at the long side 131b and extends therefrom so as to be substantially perpendicular to the long side 131b, or in other words, extends in the direction away from the long side 131b along the Y-axis direction. In addition, the other end (i.e., the second end) of the arm 114a is connected at a side surface thereof (a surface in the YZ plane) to one end of the arm 111a. The arm 114a has a width defined in the X-axis direction of approximately 20 μm and a length defined in the Y-axis direction of 40 μm. It is to be noted that the configuration of the arm 114b is similar to the configuration of the arms 114a.

In addition, the arms 112a and 112b according to the present embodiment have a length defined in the Y-axis direction of 350 μm, for example. In addition, the arms 113a and 113b according to the present embodiment connect to the frame members 140c and 140d in the regions that oppose the vicinity of the middle of the vibration arms 135A and 135D in the Y-axis direction.

Other configurations of the holding arm 110 are similar to those of the first embodiment.

FIG. 14 illustrates a relationship among the vibration arms 135, the holding arm 110, and the holding portion 140 on the section along FF' indicated in FIG. 13.

As illustrated in FIG. 14, in the present embodiment, the surface L4 of the vibration arms 135 has a shape that approaches the surface L1 of the holding portion 140, as progressing from the fixed ends of the vibration arms 135 toward the vicinity of the middle of the vibration arms 135 in the lengthwise direction (the region that opposes the point M1). Furthermore, the surface L4 has a shape that becomes spaced apart from the surface L1, as progressing from the vicinity of the middle of the vibration arms 135 in the lengthwise direction toward the free ends thereof.

It is to be noted that the relationship between the surfaces L2 and L3 and the surface L1 is similar to that of the first embodiment.

In the present embodiment, the configuration is such that the holding arm 110 connects to the holding portion 140 at the regions that oppose the vicinity of the middle of the vibration arms 135 in the lengthwise direction. Therefore, in the present embodiment, the amount of displacement of the free ends of the vibration arms 135 from the holding portion 140 is reduced to approximately 50% of the amount of displacement of the free ends of the vibration arms 135' from the holding portion 140' of the resonator 10' of the comparative example illustrated in FIG. 5B.

Furthermore, in the present embodiment, the lengths of the base portion 130, the holding arm 110, and the vibration arms 135 along the Y-axis direction are set such that the length from the front end of the base portion 130 to the other end of the arm 114a or 114b (i.e., the sum, 120 μm, of the length, 80 μm, of the base portion 130 in the Y-axis direction and the length, 40 μm, of the arm 114a or 114b in the lengthwise direction) is shorter than the length (i.e., 480 μm) of the vibration arms 135 in the lengthwise direction. With this configuration, even in a case in which the thickness of the silicon oxide layer F2' in the resonator 10 slightly varies (approximately ±20% from the mean value of the thickness), a variation in the amount of warping of the vibration arms 135 and the holding arm 110 can be reduced.

Other configurations and functions are similar to those of the first embodiment.

Sixth Embodiment

FIG. 15 illustrates an example of a plan view of a resonator 10 according to the present embodiment. Hereinafter, among the detailed configurations of a resonance device 1 according to the present embodiment, the description centers on the differences from the first embodiment.

In the present embodiment, the holding arm 110 is formed so as to be asymmetric with respect to a virtual plane P defined to be parallel to the YZ plane along the center line of the base portion 130 in the X-axis direction. Specifically, the holding arm 110 according to the present embodiment does not include a configuration corresponding to the arms 111b to 113b according to the first embodiment. Other configurations of the holding arm 110 are similar to those of the first embodiment.

Other configurations and functions are similar to those of the first embodiment.

Thus far, exemplary embodiments have been described. A resonance device 1 according to the exemplary embodiments includes a resonator 10, and an upper lid 30 and a lower lid 20 that oppose each other with the resonator 10 interposed therebetween. The resonator 10 includes a base portion 130; a plurality of vibration arms 135 that include a piezoelectric thin film F3 and a pair of electrode layers E1 and E2 that oppose each other with the piezoelectric thin film F3 interposed therebetween, that include fixed ends connected to a front end (a long side 131a) of the base portion 130, and that extend in a direction away from the base portion 130; a holding portion 140 provided in at least a portion of a periphery of the base portion 130 and the vibration arms 135; and a holding arm 110 that is connected at one end to the base portion 130 and connected at another end to the holding portion 140 at a side closer to free ends of the vibration arms 135 than the fixed ends of the plurality of vibration arms 135. The base portion 130, the plurality of vibration arms 135, and the holding arm 110 include a Si substrate F2 and a silicon oxide layer F2' that is laminated on the Si substrate F2 and that is made of a material having a coefficient of thermal expansion different from that of the Si substrate F2, and are formed integrally by the Si substrate F2 and the silicon oxide layer F2'.

With this configuration, in the resonance device 1 according to the present embodiment, the amount of displacement of the free ends of the vibration arms 135 from the holding portion 140 can be reduced. As a result, even in a case in which the vibration arms 135 undergo an out-of-plane flexural vibration, the free ends of the vibration arms 135 can be prevented from hitting the lower lid 20 or the upper lid 30.

In addition, it is preferable that the holding portion 140 include the Si substrate F2, the Si substrate F2 be formed integrally with the Si substrate F2 in the base portion 130, in the plurality of vibration arms 135A to 135D, and in the holding arm 110, the Si substrate F2 in the holding portion 140 include a surface L1 that opposes the lower lid 20, the Si substrate F2 in the base portion 130 include a surface L2 that opposes the lower lid 20, the substrate F2 in the holding arm 110 include a surface L3 that opposes the lower lid 20, a portion of the surface L2 in the base portion 130 corresponding to a rear end that opposes the front end in the base portion 130 do not lie in the same plane as the surface L1, and a portion of the surface L3 in the holding arm 110 corresponding to one end (a point M2) of the holding arm 110 do not lie in the same plane as the surface L1.

In addition, it is preferable that the Si substrate F2 in the vibration arms 135 include a surface L4 that opposes the lower lid 20 and the distance from a portion of the surface L4 corresponding to the free ends of the vibration arms 135 to the surface L1 be smaller than the distance from a portion of the surface L2 corresponding to the rear end of the base portion 130 to the surface L1.

In addition, it is preferable that a portion of the surface L4 in the vibration arms 135 corresponding to the fixed ends of the vibration arms 135 be not on the surface L1 and the surface L4 in the vibration arms 135 include a portion that approaches the surface L1, as progressing from a portion corresponding to the fixed ends of the vibration arms 135 toward a portion corresponding to the free ends of the vibration arms 135.

In addition, it is preferable that the surface L3 in the holding arm 110 become spaced apart from the surface L1, as progressing from a portion corresponding to another end of the holding arm 110 toward a portion corresponding to one end of the holding arm 110.

In addition, it is preferable that the length from the front end of the base portion 130 to the rear end of the base portion 130 be shorter than the length from the fixed ends to the free ends of the plurality of vibration arms 135A to 135D. In addition, it is preferable that the holding arm 110 include arms 114a and 114b that are connected at one ends to the rear end of the base portion 130 and extend in a direction away from the rear end and the length from the front end of the base portion 130 to another end of the arm 114a or 114b be shorter than the length from the fixed ends to the free ends of the plurality of vibration arms 135A to 135D. With this configuration, even in a case in which the thickness of the silicon oxide layer F2' slightly varies (approximately ±20% from the mean value of the thickness), a variation in the amount of warping of the vibration arms 135 and the holding arm 110 can be reduced.

In addition, it is preferable that the Si substrate F2 be formed of silicon and the temperature characteristics correction layer be formed of silicon oxide. With this configuration, it becomes easier to make the thickness of the Si substrate F2 or the temperature characteristics correction layer uniform, which thus facilitates the process.

Each of the embodiments described thus far is for facilitating the understanding of the present invention and is not intended to limit the interpretation of the present invention. Changes/improvements can be made to the present invention without departing from the spirit thereof, and equivalents of such are also included in the present invention. In other words, an embodiment obtained as a person skilled in the art has made a design change as appropriate to each of the embodiments is encompassed by the scope of the present invention as long as such an embodiment includes a feature of the present invention. For example, each of the elements provided in each of the embodiments and the arrangements, the materials, the conditions, the shapes, the sizes, and so on of such elements are not limited to those illustrated herein, and changes can be made thereto as appropriate. For example, in the embodiments described above, a configuration in which the holding arm 110 is bent twice or more has been described, but this is not a limiting example. The configuration may be such that the holding arm 110 connects the long side 131b of the base portion 130 to the frame member 140b without ever being bent, for example. In addition, the configuration may be such that the holding arm 110 connects the long side 131b of the base portion 130 to the frame member 140c or 140d after having been bent only once, for example. In this case, the size of the resonance device 1 can be reduced. In addition, each of the embodiments is illustrative in nature, it is needless to say that the configurations illustrated in different embodiments can be partially replaced or combined, and such embodiments are also encompassed by the scope of the present invention as long as they include a feature of the present invention.

REFERENCE SIGNS LIST

1 RESONANCE DEVICE
10 RESONATOR
30 UPPER LID
20 LOWER LID
140 HOLDING PORTION
140a to 140d FRAME MEMBER
110 HOLDING ARM
111a to 114a, 111b to 114b ARM
120 VIBRATION PORTION
130 BASE PORTION
131a, 131b LONG SIDE
131c, 131d SHORT SIDE
135A to 135D VIBRATION ARM
F2 Si SUBSTRATE
F2' SILICON OXIDE LAYER (TEMPERATURE CHARACTERISTICS CORRECTION LAYER)

The invention claimed is:

1. A resonance device, comprising:
an upper lid;
a lower lid that opposes the upper lid; and
a resonator interposed between the upper and lower lids, the resonator including:
a base,
a plurality of vibration arms having respective first and second ends with the respective first ends coupled to a front end of the base, such that the plurality of vibration arms extend in a direction away from the base,
a frame surrounding at least a portion of the base and the plurality of vibration arms, and
at least one holding arm having a first end coupled to the base and a second end coupled to the frame, the second end of the at least one holding arm being closer to the second end of at least one of the plurality of vibration arms than the first end of the at least one of the plurality of vibration arms,
wherein the base, the plurality of vibration arms, and the at least one holding arm include a substrate and a temperature characteristics correction layer disposed on the substrate that comprises a material having a coefficient of thermal expansion different from that of the substrate.

2. The resonance device according to claim 1, wherein the base, the plurality of vibration arms, and the at least one holding arm are formed integrally of the substrate and the temperature characteristics correction layer.

3. The resonance device according to claim 1, wherein the plurality of vibration arms each include a piezoelectric material and a pair of electrode layers that oppose each other with the piezoelectric material interposed therebetween.

4. The resonance device according to claim 3, wherein at least one of the pair of electrode layers is disposed on a first surface of the substrate with the temperature characteristics correction layer being disposed on an opposing second surface of the substrate.

5. The resonance device according to claim 2,
wherein the frame includes a substrate that is formed integrally with the substrate of the base, the plurality of vibration arms, and the at least one holding arm,
wherein the substrate of the frame includes a first surface that opposes the lower lid,
wherein the substrate of the base includes a second surface that opposes the lower lid,
wherein the substrate of the at least one holding arm includes a third surface that opposes the lower lid,
wherein at least a portion of the second surface of the substrate of the base corresponding to a rear end that opposes the front end of the base does not lie in a same plane as the first surface, and
wherein a portion of the third surface of the substrate of the at least one holding arm corresponding to the first end of the holding arm does not lie in a same plane as the first surface.

6. The resonance device according to claim 5,
wherein the substrate of the plurality of vibration arms includes a fourth surface that opposes the lower lid, and
wherein a distance from a portion of the fourth surface corresponding to the second ends of the plurality of vibration arms to the first surface is smaller than a distance from a portion of the second surface corresponding to the rear end of the base to the first surface.

7. The resonance device according to claim 6,
wherein a portion of the fourth surface of the substrate of the plurality of vibration arms corresponding to the second ends of the plurality of vibration arms is not on the first surface, and
wherein the fourth surface of the substrate of the plurality of vibration arms includes a portion that approaches the first surface, as progressing from a portion corresponding to the first ends of the plurality of vibration arms towards a portion corresponding to the second ends of the plurality of vibration arms.

8. The resonance device according to claim 6, wherein the third surface of the substrate of the at least one holding arm spaces apart from the first surface progressing from the second end of the at least one holding arm towards the first end of the at least one holding arm.

9. The resonance device according to claim 1, wherein a length from the front end of the base to a rear end of the base opposite the front end is shorter than a length from the first end to the second end of at least one of the plurality of vibration arms.

10. The resonance device according to claim 1, wherein the at least one holding arm includes a sub-arm with a first end coupled to a rear end of the base opposite the front end and that extends away from the rear end of the base.

11. The resonance device according to claim 10, wherein a length from the front end of the base to a second end of the sub-arm opposite the first end is shorter than a length from the second end to the first end of at least one of the plurality of vibration arms.

12. The resonance device according to claim 1, wherein the substrate is formed of silicon, and the temperature characteristics correction layer is formed of silicon oxide.

13. The resonance device according to claim 1, wherein the first end of at least one holding arm is coupled to the base between a pair of the plurality of vibration arms and the second end of the at least one holding arm is coupled to the frame.

14. The resonance device according to claim 1, wherein the at least one holding arm comprises a pair of holding arms extending in a direction parallel to the plurality of vibration arms and that are each connected to a surface of the frame that faces the respective second ends of the plurality of vibration arms.

15. A resonance device, comprising:
an upper lid;
a lower lid that opposes the upper lid; and a resonator disposed between the upper and lower lids, the resonator including:
- a frame,
- a base disposed within the frame,
- a plurality of vibration arms coupled to the base and extending away from the base towards at least a first side of the frame,
- at least one holding arm coupling the base to the frame with a frame connecting end coupling the at least one holding arm to the frame and being closer to a free end of at least one of the plurality of vibration arms than to the base, wherein the base, the plurality of vibration arms, and the at least one holding arm include a substrate and a temperature characteristics correction layer disposed on the substrate that comprises a material having a coefficient of thermal expansion different from that of the substrate, and wherein the base, the plurality of vibration arms, and the at least one holding arm integrally formed with the substrate and the temperature characteristics correction layer.

16. The resonance device according to claim 15, wherein the plurality of vibration arms each include a piezoelectric material and a pair of electrode layers that oppose each other with the piezoelectric material interposed therebetween.

17. The resonance device according to claim 16, wherein at least one of the pair of electrode layers is disposed on a first surface of the substrate with the temperature characteristics correction layer being disposed on an opposing second surface of the substrate.

18. The resonance device according to claim 15, wherein a length from a front end of the base where the plurality of vibration arms are coupled to a rear end of the base opposite the front end is shorter than a length of at least one of the plurality of vibration arms.

19. The resonance device according to claim 15,
wherein the at least one holding arm includes a sub-arm with a first end coupled to an end of the base opposite to an end where the plurality of vibration arms are coupled and that extends away from the rear end of the base a direction orthogonal to a lengthwise direction of the plurality of vibration arms, and
wherein a length from the first end of the sub-arm to a second end of the sub-arm coupled to the frame is shorter than a length of at least one of the plurality of vibration arms.

20. The resonance device according to claim 15, wherein the substrate is formed of silicon, and the temperature characteristics correction layer is formed of silicon oxide.

* * * * *